(12) United States Patent
Yagishita

(10) Patent No.: US 8,050,121 B2
(45) Date of Patent: Nov. 1, 2011

(54) SEMICONDUCTOR MEMORY, SYSTEM, OPERATING METHOD OF SEMICONDUCTOR MEMORY, AND MANUFACTURING METHOD OF SEMICONDUCTOR MEMORY

(75) Inventor: Yoshimasa Yagishita, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/851,452

(22) Filed: Aug. 5, 2010

(65) Prior Publication Data

US 2010/0322024 A1    Dec. 23, 2010

Related U.S. Application Data

(63) Continuation of application No. PCT/JP2008/000654, filed on Mar. 19, 2008.

(51) Int. Cl.
*G11C 7/00*    (2006.01)
*G11C 8/00*    (2006.01)

(52) U.S. Cl. ...... 365/200; 365/201; 365/222; 365/225.7; 365/230.03; 365/185.09; 365/185.11

(58) Field of Classification Search .......... 365/200, 365/201, 225.7, 230.03, 185.09, 185.11, 365/222

See application file for complete search history.

(56) References Cited

U.S. PATENT DOCUMENTS

| | | | | |
|---|---|---|---|---|
| 5,148,398 A | | 9/1992 | Kohno | |
| 5,396,124 A | * | 3/1995 | Sawada et al. | 365/200 |
| 5,416,740 A | * | 5/1995 | Fujita et al. | 365/200 |
| 5,485,425 A | * | 1/1996 | Iwai et al. | 365/200 |
| 5,544,106 A | | 8/1996 | Koike | |
| 5,652,725 A | * | 7/1997 | Suma et al. | 365/200 |
| 5,708,612 A | | 1/1998 | Abe | |
| 5,835,424 A | * | 11/1998 | Kikukawa et al. | 365/200 |
| 5,970,003 A | * | 10/1999 | Miyatake et al. | 365/200 |
| 6,094,381 A | * | 7/2000 | Isa | 365/200 |
| 6,388,929 B1 | * | 5/2002 | Shimano et al. | 365/200 |
| 6,459,630 B2 | * | 10/2002 | Nakayama et al. | 365/200 |
| 6,462,993 B2 | * | 10/2002 | Shinozaki | 365/200 |
| 6,496,413 B2 | * | 12/2002 | Taura et al. | 365/200 |
| 6,496,428 B2 | * | 12/2002 | Ohno et al. | 365/200 |
| 6,496,429 B2 | * | 12/2002 | Murai et al. | 365/200 |
| 6,519,192 B2 | * | 2/2003 | Ooishi | 365/200 |
| 6,538,924 B2 | * | 3/2003 | Dono et al. | 365/200 |
| 6,707,733 B2 | * | 3/2004 | Taura et al. | 365/200 |
| 6,894,922 B1 | * | 5/2005 | Hidaka | 365/200 |
| 6,917,548 B2 | * | 7/2005 | Kim et al. | 365/200 |
| 7,088,627 B1 | * | 8/2006 | Bajwa et al. | 365/200 |
| 7,099,208 B2 | * | 8/2006 | Okuyama et al. | 365/200 |

(Continued)

FOREIGN PATENT DOCUMENTS

JP    3-22300 A    1/1991

(Continued)

*Primary Examiner* — Trong Phan
(74) *Attorney, Agent, or Firm* — Arent Fox LLP

(57) ABSTRACT

A plurality of memory blocks includes real memory cells and redundancy memory cells, are accessed independently during a normal operation mode, and are accessed simultaneously during a test mode in order for common data to be written to the plurality of memory blocks. A block control unit selects the plurality of memory blocks irrespective of a block address signal in order to execute a compression test. During the test mode, a redundancy access unit simultaneously accesses the redundancy memory cells of the plurality of memory blocks when a forced redundancy signal supplied to a block address terminal indicates first level. Therefore, the redundancy memory cells of the plurality of memory blocks may simultaneously access and test without providing any special terminal. As a result, before a defect is relieved, an operation test of the redundancy memory cells may efficiently execute, which may shorten the test time.

13 Claims, 32 Drawing Sheets

U.S. PATENT DOCUMENTS

| | | | |
|---|---|---|---|
| 7,257,020 B2 * | 8/2007 | Hidaka | 365/200 |
| 7,281,155 B1 * | 10/2007 | Eto et al. | 365/200 |
| 7,286,431 B2 * | 10/2007 | Hidaka | 365/200 |
| 7,379,359 B2 * | 5/2008 | Sakakibara | 365/200 |
| 7,385,863 B2 * | 6/2008 | Nishihara et al. | 365/200 |
| 7,821,854 B2 * | 10/2010 | Kobayashi | 365/200 |
| 7,903,482 B2 * | 3/2011 | Ozeki | 365/200 |
| 2006/0044897 A1 | 3/2006 | Maki | |

FOREIGN PATENT DOCUMENTS

| | | |
|---|---|---|
| JP | 3-37900 A | 2/1991 |
| JP | 3-286498 A | 12/1991 |
| JP | 6-243698 A | 9/1994 |
| JP | 7-226100 A | 8/1995 |
| JP | 2629645 B2 | 4/1997 |
| JP | 2006-73111 A | 3/2006 |

* cited by examiner

SEMICONDUCTOR MEMORY, SYSTEM, OPERATING METHOD OF SEMICONDUCTOR MEMORY, AND MANUFACTURING METHOD OF SEMICONDUCTOR MEMORY

CROSS-REFERENCE TO RELATED APPLICATION

This application is based upon and claims the benefit of the prior International Application No. PCT/JP2008/000654, filed on Mar. 19, 2008, the entire contents of which are incorporated herein by reference.

FIELD

The present embodiment relates to a semiconductor memory that includes redundancy memory cells for relieving a defect and has a compression test function.

BACKGROUND

A semiconductor memory has redundancy memory cells for relieving a defect and improving yields. The redundancy memory cells are accessed instead of real memory cells based on a defect address programmed in a fuse or the like. Before a defect is relieved, the redundancy memory cells may not be accessed and may not undergo an operation test, either. For example, in order to cause the execution of the operation test of the redundancy memory cells before the defect is relieved, a test signal is supplied to an external terminal. Related arts are discussed in Japanese Laid-open Patent Publication No. 2006-73111, No. 07-226100, and No. 06-243698.

To shorten the test time of the semiconductor memory, a compression test in which one write data signal is written to a plurality of memory cells having different addresses is executed. A related art is discussed in Japanese Laid-open Patent Publication No.

When the test signal is supplied to the external terminal, the semiconductor memory enters a dedicated test mode and the operation test of the redundancy memory cells is executed one by one. There has been proposed no method for executing the operation test of the redundancy memory cells in a compression test. Therefore, there has been a problem that the operation test of the redundancy memory cells takes a lot of time.

SUMMARY

According to an aspect of the embodiments, a semiconductor memory includes a plurality of memory blocks being accessed independently during a normal operation mode, being accessed simultaneously during a test mode in order for common data to be written to the plurality of memory blocks, and including real memory cells and redundancy memory cells; a block control unit selecting one of the memory blocks according to a block address signal specifying one of the memory blocks during the normal operation mode, and selecting the plurality of memory blocks irrespective of the block address signal during the test mode; and a redundancy access unit accessing the redundancy memory cells of one of the memory blocks corresponding to the block address signal when an external address signal matches a defect address during the normal operation mode, and simultaneously accessing the redundancy memory cells of the plurality of memory blocks when a forced redundancy signal indicates a first level during the test mode, the forced redundancy signal being supplied to one of a block address terminal receiving the block address signal and a part of external address terminals receiving the external address signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
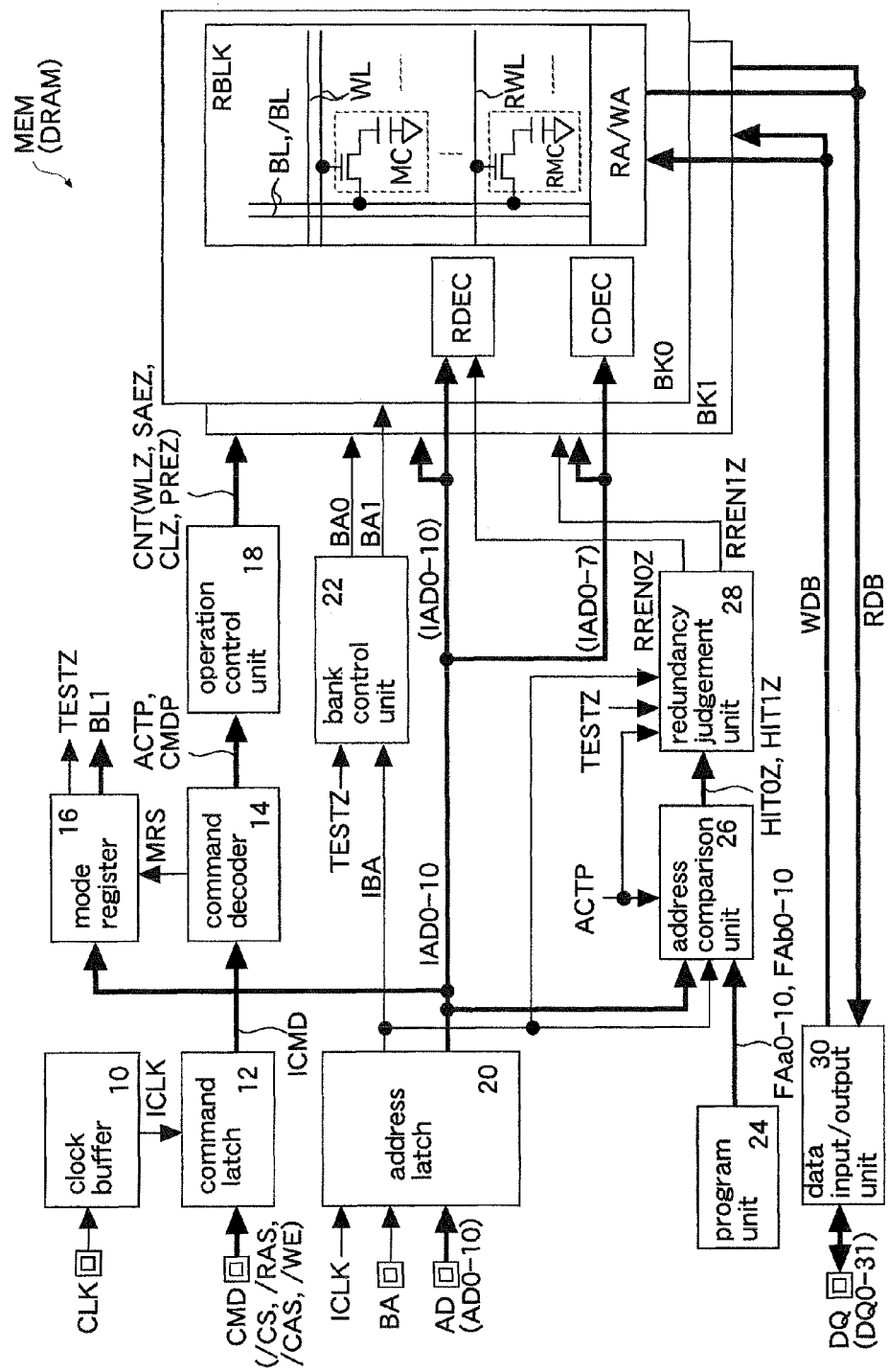
FIG. 1 illustrates one embodiment.

Hereinafter, embodiments will be described with reference to the drawings. In the drawings, each thick line represents a signal line that includes a plurality of lines. Some of the blocks connected with the thick lines include a plurality of circuits each. Signal lines for transmitting signals are designated by the same reference symbols as the names of the signals. Signals ending in "Z" are of positive logic. Signals heading in "/" are of negative logic. A double square mark in the drawings represents an external terminal. The external terminal is, for example, a pad on a semiconductor memory chip, or a lead of a package to which the semiconductor memory chip is molded. Signals supplied through the external terminals are designated by the same reference symbols as the names of the terminals.

FIG. 1 illustrates one embodiment. For example, a semiconductor memory MEM is a DRAM (Dynamic RAM). The semiconductor memory MEM may be designed as a semiconductor memory device sealed in a package or may be designed as a memory macro (IP; Intellectual Property) mounted on a system LSI (Large Scale Integration) or the like.

The semiconductor memory MEM has a clock buffer 10, a command latch 12, a command decoder 14, a mode register 16, an operation control unit 18, an address latch 20, a bank control unit 22, a program unit 24, an address comparison unit 26, a redundancy judgment unit 28, a data input/output unit 30, and banks BK0, BK1 (memory blocks). For example, the semiconductor memory MEM may have a refresh timer periodically generating an internal refresh request for automatic execution of a refresh operation during a self refresh mode, a refresh address counter generating a refresh address signal indicating a memory cell to be refreshed, and an address selector for supplying either an external address signal AD0-10 (row address signal) or the refresh address signal to row decoders RDEC.

The clock buffer 10 outputs a clock signal CLK as an internal clock signal ICLK. The internal clock signal ICLK is supplied to circuits operating in response to the clock signal CLK, such as the command latch 12, the address latch 20, and the data input/output unit 30. Incidentally, for the purpose of reducing power consumption of the semiconductor memory MEM, a clock enable signal may be supplied to the clock buffer 10 so that the internal clock signal ICLK is not output during a low-level period of the clock enable signal.

The command latch 12 latches a command signal CMD in synchronization with a rising edge of the internal clock signal ICLK to output the latched signal as an internal command signal ICMD to the command decoder 14. The command signal CMD includes a chip select signal /CS, a row address strobe signal /RAS, a column address strode signal /CAS, and a write enable signal /WE.

According to logic level of the internal command signal ICMD, the command decoder 14 outputs an active command signal ACTP for activating the banks BK0-1 and an access command signal CMDP for executing an access operation (a read operation, a write operation, or a refresh operation) of the banks BK0-1, or outputs a mode register set command signal MRS for setting the mode register 16. The access command signal CMDP indicates one of a read command which executes the read operation, a write command which executes the write operation, and a refresh command which executes the refresh operation.

The mode register set command signal MRS is generated when the combination of the command signals CMD not used in a normal access operation is received. The command latch 12 and the command decoder 14 receive an active command ACT activating a word line WL, and receive a write command WR and a read command RD which access to memory cells MC or redundancy memory cells RMC coupled to the activated word line WL.

The mode register 16 has a plurality of registers that are set when the mode register 16 receives an internal address signal IAD0-10 in response to the mode register set command signal MRS. The mode register 16 is also called a configuration register. Incidentally, the mode register 16 may be set in response to a data signal DQ. The mode register 16 outputs mode signals according to values set in the registers. The operation control unit 18, the data input/output unit 30, and at least one of the banks BK0-1 operate in an operation mode corresponding to the mode signals. For example, a read latency and a burst length BL1 are set in the mode register 16. The read latency is the number of clocks from the receipt of the read command RD up to the start of the output of read data. The burst length is the number of times a data signal is output from a data terminal DQ in response to one read command RD, and the number of times the data terminal DQ receives a data signal in response to one write command WR.

A value indicating the burst length BL1 is transmitted to, for example, a burst control circuit. The burst control circuit generates a burst clock signal having pulses as many as the number indicated by the burst length BL1 and outputs the burst clock signal to the data input/output unit 30. Then, the data signal DQ is input to the semiconductor memory MEM (write operation) or output from the semiconductor memory MEM (read operation) the number of times corresponding to the burst length BL1. Incidentally, this embodiment may be applied to a semiconductor memory MEM not having the burst control circuit, that is, may be applied to a semiconductor memory MEM that outputs one data signal DQ per read command RD and receives one data per write command WR.

The mode register 16 may further have a test register used when the semiconductor memory MEM is tested. When receiving the internal address signal IAD0-10 indicating a compression test mode along with the mode register set command signal MRS, the mode register 16 activates a test signal TESTZ to high level so that the semiconductor memory MEM enters the compression test mode. For example, to exit from the test mode (return to a normal operation mode), the test register is reset by an exit command or by re-supply of power. Details of the compression test mode will be described later.

The operation control unit 18 outputs control signals CNT for activating each of the banks BK0-1 in response to the active command signal ACTP, or outputs control signals CNT for executing the access operation of each of the banks BK0-1 in response to the access command signal CMDP. The control signals CNT include timing signals controlling the operation of row blocks RBLK, such as a word line control signal WLZ, a sense amplifier control signal SAEZ, a column control signal CLZ, and a precharge control signal PREZ. The word line control signal WLZ decides an activation timing of a word line WL. The sense amplifier control signal SAEZ decides an activation timing of a sense amplifier. The column control signal CLZ decides an on-timing of column switches. The precharge control signal PREZ decides a precharge timing of bit lines BL, /BL. When the refresh operation is to be executed, the control signals CNT except the column control signal CLZ is output. The address latch 20 latches a bank address signal BA (block address signal) and an address signal AD (AD0-10) in synchronization with a rising edge of the internal clock signal ICLK to output the latched signals as an internal bank address signal IBA and the internal address signal IAD (IAD0-10) respectively. The semiconductor memory MEM of this embodiment adopts an address multiplex system. Therefore, the internal address signal IAD0-10 is supplied as a row address signal to the row decoders RDEC, or the internal address signal IAD0-7 is supplied as a column address signal to the column decoders CDEC. That is, the row address signal and the column address signal are supplied to a common address terminal AD at different timings. The row address signal is used for selecting a word line WL. The column address signal is used for selecting a bit line pair BL, /BL.

During the normal operation mode (TESTZ=low level), the bank control unit 22 activates a bank active signal BA0 for selecting the bank BK0 when the bank address signal BA (IBA) has low level, and activates a bank active signal BA1 for selecting the bank BK1 when the bank address signal BA (IBA) has high level. Further, the bank control unit 22 activates both the bank active signals BA0-1 irrespective of a value of the bank address signal BA (IBA) during the test mode (TESTZ=high level; compression test mode). Then, a common data signal is written to the banks BK0-1 and the common data signal is read from the banks BK0-1, whereby a compression test is executed.

The program unit 24 stores a row address signal indicating a word line WL corresponding to a defect by programming a fuse that it has internally and outputs the stored row address signal as fuse row address signals (redundancy address signals) FAa0-10, FAb0-10. The address signal FAa0-10 indicates a defect address of the bank BK0, and the address signal FAb0-10 indicates a defect address of the bank BK1. In this embodiment, the semiconductor memory MEM has row redundancy circuits (redundancy memory cells RMC, redundancy word lines RWL, and the like) for relieving a defect on per word line WL basis. Incidentally, the program unit 24 may be formed by using a nonvolatile memory cell or the like.

The address comparison unit 26 compares the external address AD0-10 (row address signal) supplied along with the active command (ACTP) and the redundancy address signal FAa0-10 or FAb0-10 (defect address) bit by bit, and when all the bit values match, it activates one of hit signals HIT0Z. HIT1Z according to the bank address signal BA (IBA). The hit signal HIT0Z is output for selecting the redundancy word line RWL of the bank BK0. The hit signal HIT1Z is output for selecting the redundancy word line RWL of the bank BK1.

During the normal operation mode, the redundancy judgment unit 28 activates a redundancy enable signal RREN0Z (result of redundancy judgment) when the hit signal HIT0Z is active, and activates a redundancy enable signal RREN1Z (result of the redundancy judgment) when the hit signal HIT1Z is active. By the activation of the redundancy enable signal RREN0Z, the activation of a real word line WL of the bank BK0 is prohibited and the activation of the redundancy word line RWL of the bank BK0 is permitted. By the activation of the redundancy enable signal RREN1Z, the activation of a real word line WL of the bank BK1 is prohibited and the activation of the redundancy word line RWL of the bank BK1 is permitted. Consequently, the real word line WL corresponding to the defect is replaced by the redundancy word line RWL in each of the banks BK0-1, so that the defect is relieved.

Further, when receiving the high-level bank address signal IBA (BA; forced redundancy signal) along with the active command signal ACTP during the test mode, the redundancy judgment unit 28 activates both of the redundancy enable signals RREN0Z, RREN1Z. That is, the redundancy judgment unit 28 judges level of the forced redundancy signal (JR illustrated in FIG. 2) in response to the active command ACT. Consequently, during the test mode, the redundancy word lines RWL of the banks BK0-1 are simultaneously selected, and a common data signal is written to the redundancy memory cells RMC.

The address comparison unit 26 and the redundancy judgment unit 28 operate as a redundancy access unit which accesses the redundancy memory cells RMC of one of the banks BK0-1 corresponding to the bank address signal BA when the external address signal AD0-10 and the defect address FAa0-10 or FAb0-10 match each other, and during the test mode, simultaneously accesses the redundancy memory cells RMC of the banks BK0-1 when the forced redundancy signal (JR) supplied to a bank address terminal BA receiving the bank address signal BA indicates high level (first level).

The data input/output unit 30 has, for example, a data input unit and a data output unit. The data input unit sequentially latches write data signals received at the data terminal DQ in synchronization with rising edges of a write data clock signal, converts the latched serial write data signals to parallel data signals, and outputs the converted data signals to a write data bus WDB. The data output unit converts parallel read data signals on a read data bus RDB to serial data signals and sequentially outputs the converted data signals to the data terminal DQ in response to a read data clock signal. The write data clock signal and the read data clock signal each has pulses as many as the number indicated by the burst length BL1 and are generated in response to the internal clock signal ICLK.

In a read operation during the compression test mode, the data output unit selects the read data signal output from one of the banks BK0-1 according to the bank address signal BA (block address signal) to output the selected read data signal. In this embodiment, for example, the data terminal DQ has 32 bits (DQ0-31). However, in the following description, the data terminal DQ corresponding to one bit will be focused on.

The banks BK0-1 have the same circuit configuration. The banks BK0-1 each have the row decoder RDEC, the column decoder CDEC, the row block RBLK, a read amplifier RA, and a write amplifier WA. The row decoder RDEC activates one of the word lines WL according to the row address signal IAD0-10 Further, in response to the activation of the redundancy enable signal RREN0Z (or RREN1Z), the row decoder RDEC prohibits the selection of the word line WL and activates the redundancy word line RWL.

The column decoder CDEC turns on the column switch according to the column address signal IAD0-7 in order to select the bit line pairs BL, /BL as many as the bit number of the data terminal DQ, for instance. During the read operation, the read amplifier RA amplifies complementary read data output via the column switch and outputs the amplified complementary read data to the read data bus RDB. During the write operation, the write amplifier WA amplifies complementary write data supplied via the write data bus WDB to supply the amplified complementary write data to the bit line pairs BL, /BL via the column switch.

The row blocks RBLK each have the plural dynamic memory cells MC arranged in matrix, the plural word lines WL each coupled to an array of the memory cells MC arranged in a lateral direction in FIG. 1, the redundancy word line RWL coupled to an array of the redundancy memory cells RMC arranged in the lateral direction in FIG. 1, and the plural bit line pairs BL, /BL each coupled to an array of the memory cells MC, RMC arranged in a vertical direction in FIG. 1. The memory cells MC. RMC each has a capacitor for retaining data as electric charges, and a transfer transistor for coupling one end of the capacitor to the bit line (or /BL). The other end of the capacitor is coupled to a reference voltage line.

Figure 2:
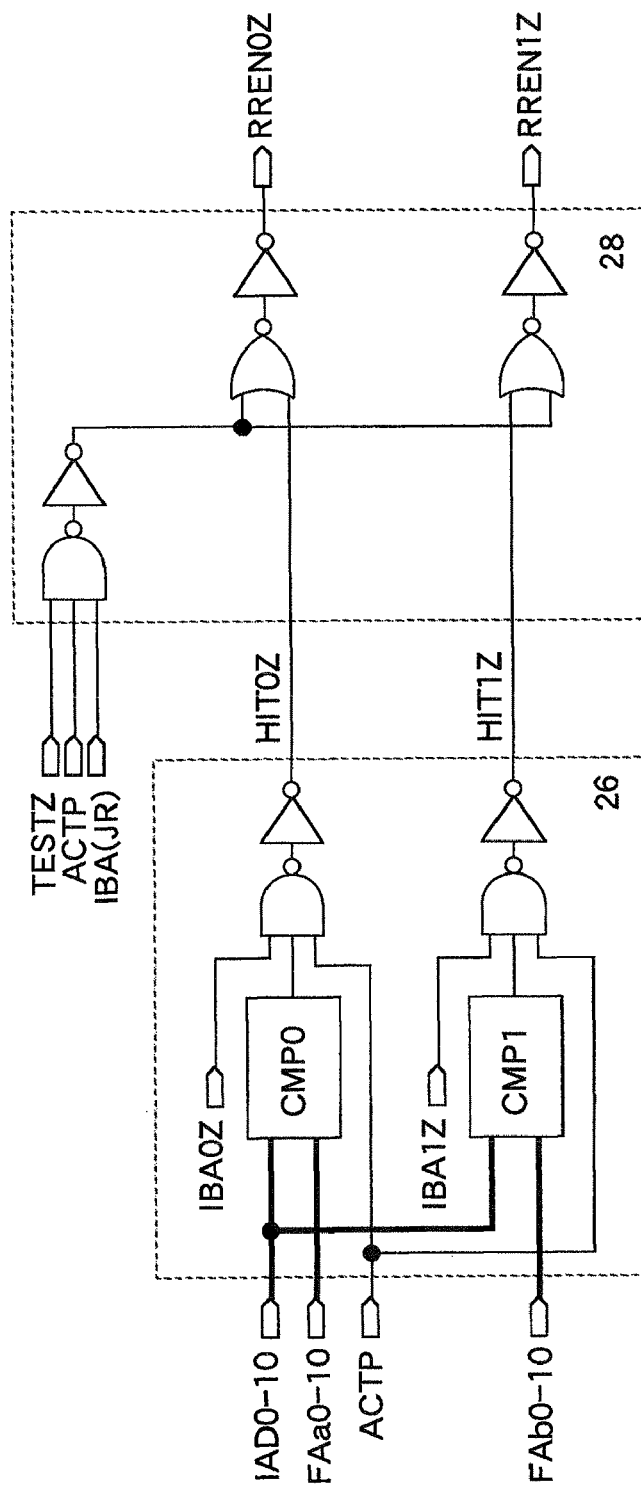
FIG. 2 illustrates details of an address comparison unit and a redundancy judgment unit illustrated in FIG. 1.

FIG. 2 illustrates details of the address comparison unit 26 and the redundancy judgment unit 28 illustrated in FIG. 1. The address comparison unit 26 has an address comparison circuit CMP0 comparing the row address signal IAD0-10 and the defect address signal FAa0-10 of the bank BK0, and an address comparison circuit CMP1 comparing the row address signal IAD0-10 and the defect address signals FAb0-10 of the bank BK1.

When the bank BK0 is selected in response to the active command (ACTP=high level, IBA0Z=high level) and a defect is detected, the hit signal HIT0Z is activated. When the bank BK1 is selected in response to the active command (ACTP=high level, IBA1Z=high level) and a defect is detected, the hit signal HIT1Z is activated. The bank address IBA0Z changes to high level when the bank address signal BA has low level (indicates the bank BK0). The bank address IBA1Z changes to high level when the bank address signal BA has high level (indicates the bank BK1). The address comparison unit 26 internally generates the bank addresses IBA0Z, IBA1Z by, for example, using the bank address signal BA.

The redundancy judgment unit 28 activates one of the redundancy enable signals RREN0-1Z corresponding to the hit signals HIT0-1Z when the test signal TESTZ has low level (during the normal operation mode). During a high-level period of the test signal TESTZ (during the compression test mode), the redundancy judgment unit 28 activates both the redundancy enable signals RREN0-1Z when the bank address signal IBA (forced redundancy signal JR) supplied along with the active command has high level.

In this embodiment, during the compression test mode, since the banks BK0-1 are accessed simultaneously, the bank address signal BA is not necessary. The bank address signal BA supplied along with the active command during the compression test mode is used as the forced redundancy bit JR. When the forced redundancy bit JR has high level, the redundancy word lines RWL of the banks BK0-1 are forcibly selected irrespective of the value of the row address signal IAD0-10. That is, during the compression test mode, the compression test of the redundancy memory cells RMC may execute according to the level of the forced redundancy bit JR. Incidentally, the redundancy judgment unit 28 may have a hold circuit holding high levels of the redundancy enable signals RREN0-1Z during an active period.

Figure 3:
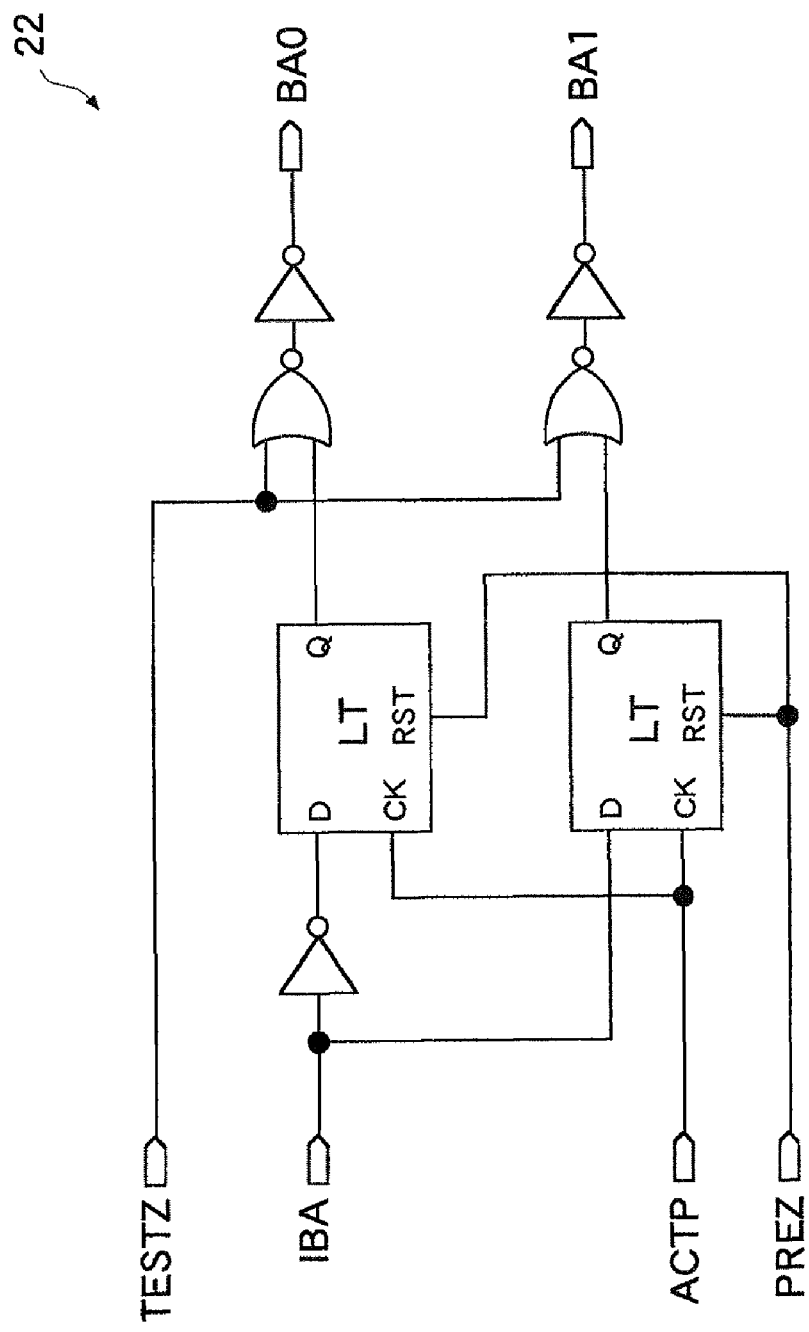
FIG. 3 illustrates details of a bank control unit illustrated in FIG. 1.

FIG. 3 illustrates details of the bank control unit 22 illustrated in FIG. 1. The bank control unit 22 has a pair of latches LT, including terminals D, CK, RST, and Q, that latch inversion level of the internal bank address signal IBA and level of the internal bank address signal IBA in synchronization with a rising edge of the active command signal ACTP and are reset in synchronization with a rising edge of the precharge control signal PREZ. During the normal operation mode, outputs Q of the latches LT are output as the bank active signals BA0-1 respectively. During the compression test mode, the bank active signals BA0-1 are both activated.

Figure 4:
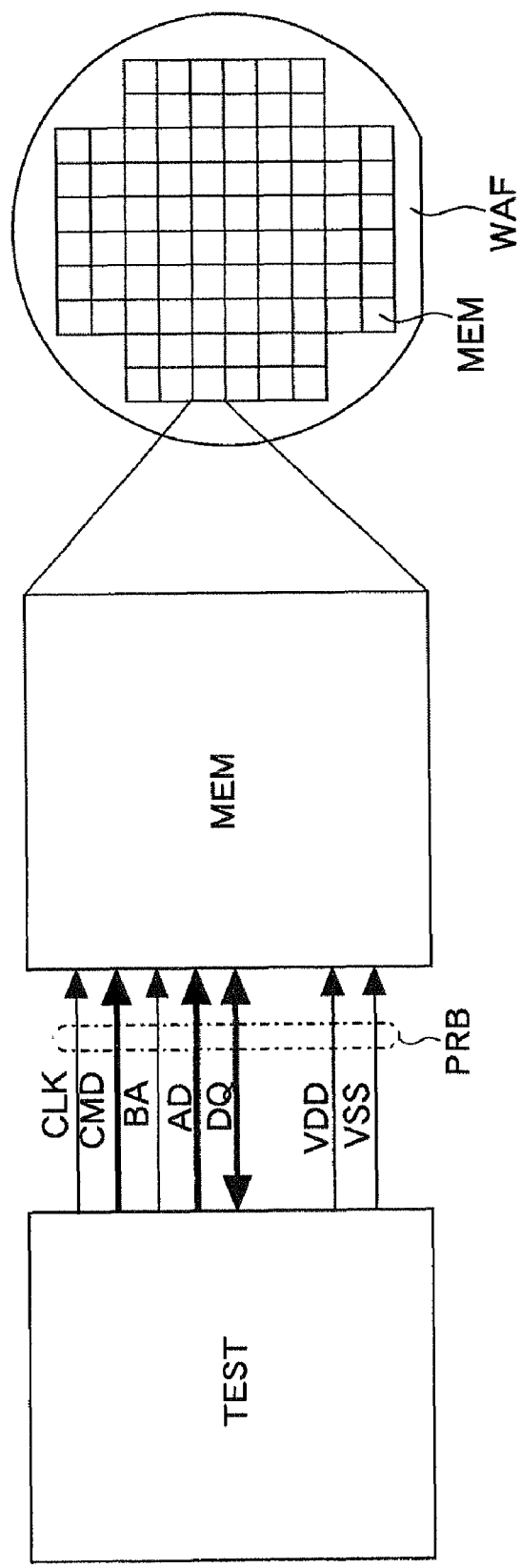
FIG. 4 illustrates a test system for testing a memory in FIG. 1.

FIG. 4 illustrates a test system for testing the semiconductor memory MEM illustrated in FIG. 1. In later-described embodiments, the same test system as that in FIG. 4 is also used though some of the signals names are different. First, a plurality of the semiconductor memories MEM are formed on a semiconductor wafer WAF by semiconductor manufacturing processes. The semiconductor memories MEM are tested by an LSI tester TEST before being cut out from the wafer WAF. The LSI tester TEST supplies not only control signals but also a power supply voltage VDD and a ground voltage VSS. The semiconductor memories MEM may be coupled to the LSI tester TEST via, for example, a probe PRB of a probe card. In FIG. 4, the single semiconductor memory MEM is coupled to the LSI tester TEST, but plural ones of the semiconductor memories MEM (for example, four) may be coupled to the LSI tester TEST at one time. The number of the semiconductor memories MEM coupled to the LSI tester TEST at one time depends on the number of terminals of the LSI tester TEST and the number of terminals of the semiconductor memories MEM.

The LSI tester TEST supplies a clock signal CLK, a command signal CMD, address signals BA, AD, and a write data signal DQ to the semiconductor memory MEM and receives a read data signal DQ from the semiconductor memory MEM. In order to execute the compression test of the semiconductor memory MEM, the LSI tester TEST makes the semiconductor memory MEM enter the compression test mode. Then, during the compression test mode, not only the real memory cells MC but also the redundancy memory cells MC are tested.

Figure 6:
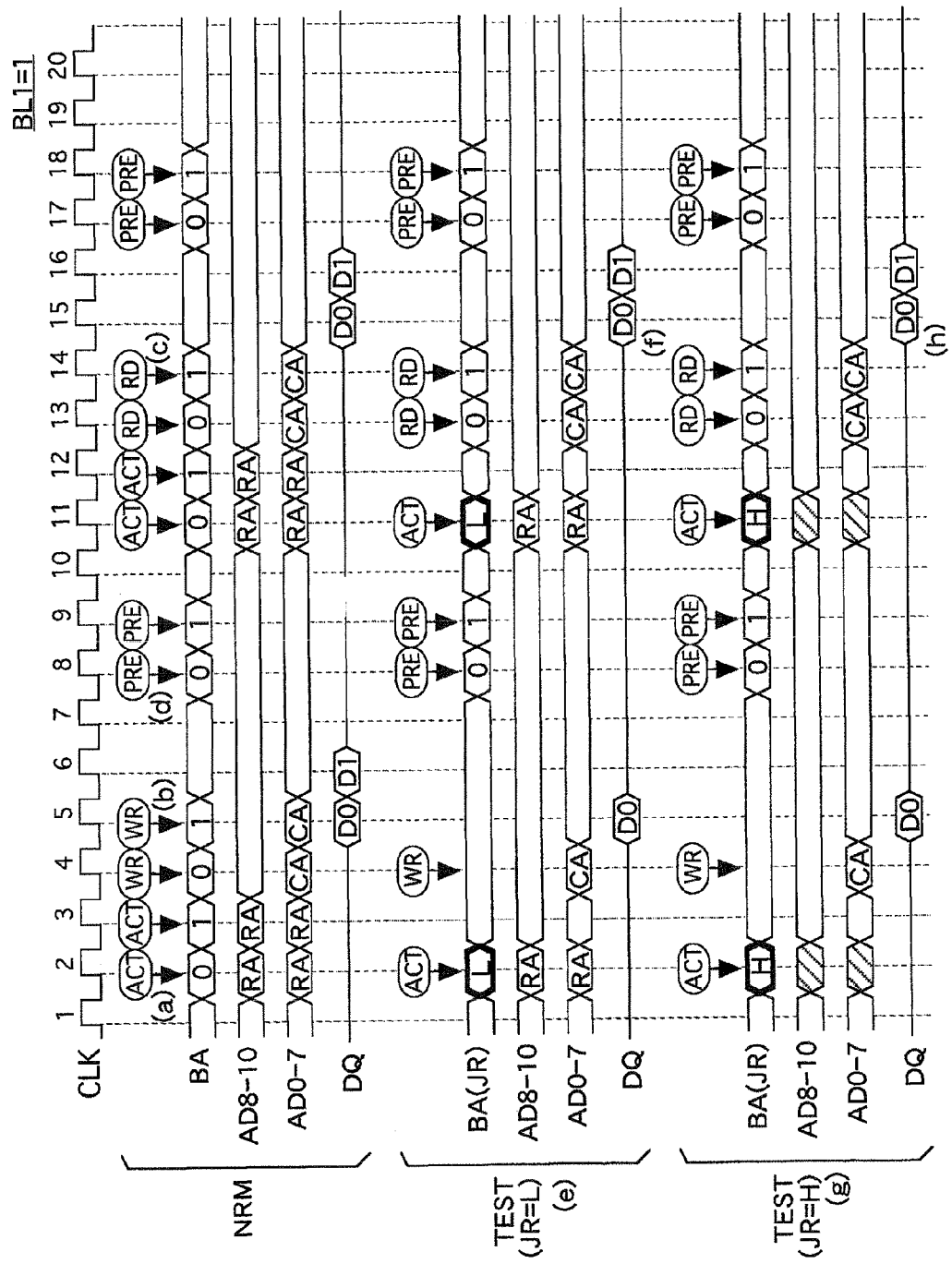
FIG. 6 illustrates operations of the memory illustrated in FIG. 1.

Concretely, as illustrated in FIG. 6 described later, when the low-level forced redundancy signal JR is supplied to the semiconductor memory MEM, a common write data signal is written to the real memory cells MC of the banks BK0-1 simultaneously. Thereafter, the data signals are read out sequentially from the real memory cells MC of the banks BK0-1 and are compared with an expected value. That is, the compression test of the real memory cells MC is executed.

Further, when the high-level forced redundancy signal JR is supplied to the semiconductor memory MEM, a common write data signal is written to the redundancy memory cells RMC of the banks BK0-1 simultaneously. Thereafter, the data signals are read out sequentially from the redundancy memory cells RMC of the banks BK0-1 and are compared with an expected value. That is, the compression test of the redundancy memory cells RMC is executed. Thus, during the single compression test mode, only by switching the level of the forced redundancy signal JR, the compression test of the real memory cells MC or the redundancy memory cells RMC is executed and a defect is detected.

When a defect of the real memory cell MC may not be relieved due to the presence of a defect in the redundancy memory cell RMC, this semiconductor memory MEM is excluded as a bad product. In the semiconductor memory MEM whose defect is judged to be relievable by the redundancy memory cell RMC, a defect address is programmed by the program unit 24 based on the result of the defect detection, and a final test is executed. Then, the manufacturing processes of the semiconductor memory MEM are completed.

Figure 5:
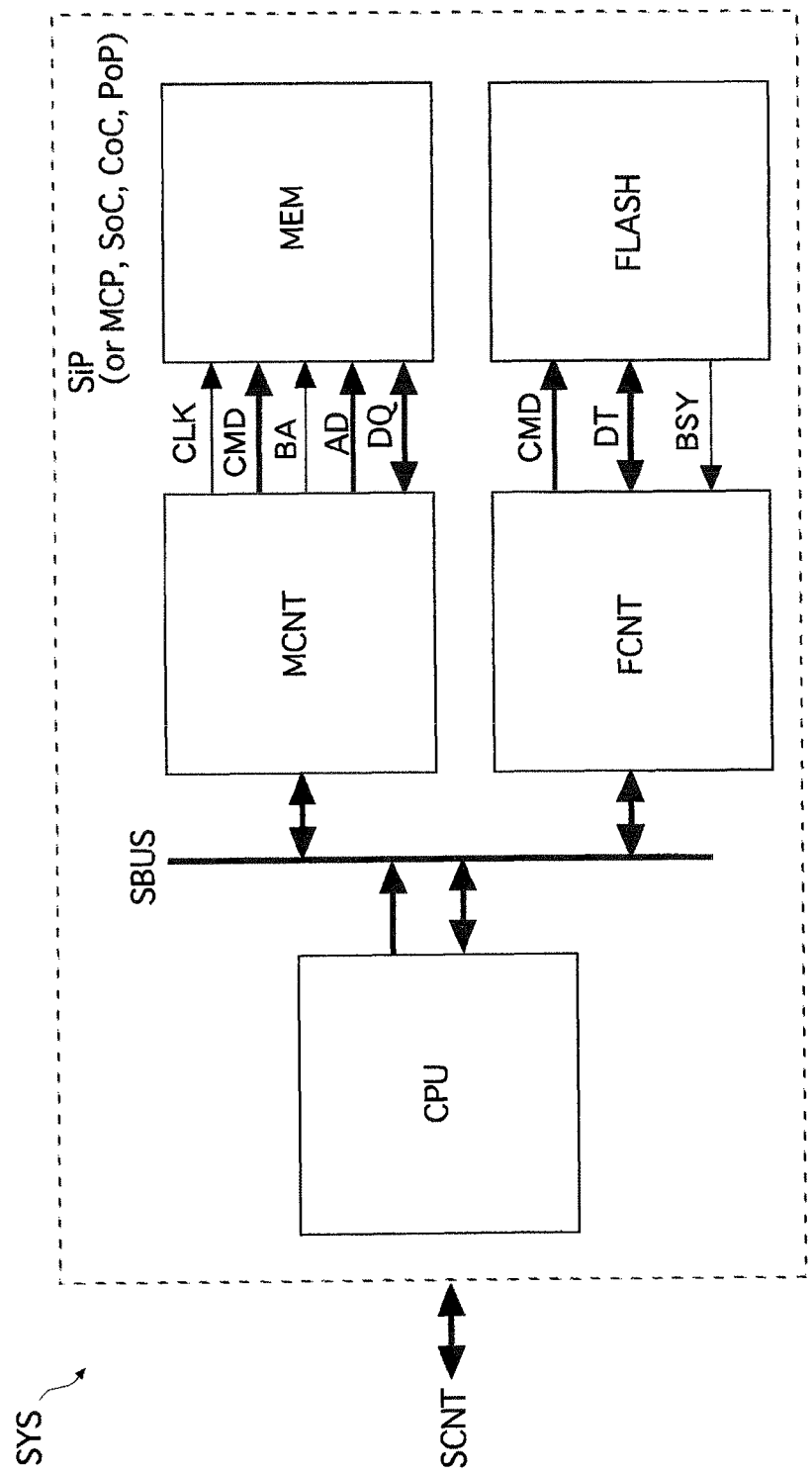
FIG. 5 illustrates a system (memory system) in which the memory illustrated in FIG. 1 is mounted.

FIG. 5 illustrates a system SYS (memory system) in which the semiconductor memory MEM illustrated in FIG. 1 is mounted. The system SYS is part of a portable equipment such as a mobile phone, for instance. The same system as that in FIG. 5 is also formed in the later-described embodiments though some of the signal names are different. The system SYS has a system-in-package SIP in which a plurality of chips are mounted on a package board such as a lead frame. Alternatively, the system SYS has a multi chip package MCP in which a plurality of chips are stacked on a package board. Alternatively, the system SYS has a system-on-chip (SoC) in which a plurality of macros are integrated on a silicon substrate. Further, the system SYS may be in a form of a chip-on-chip (CoC) or a package-on-package (PoP).

For example, the SiP has the semiconductor memory MEM illustrated in FIG. 1, a memory controller MCNT accessing the semiconductor memory MEM, a flash memory FLASH, a memory controller FCNT accessing the flash memory FLASH, and a CPU (controller) controlling the whole system. The CPU and the memory controllers MCNT, FCNT are coupled with one another via a system bus SBUS. The S/P is coupled to a higher-order system via an external bus SCNT. For the execution of the read operation of the semiconductor memory MEM, the CPU outputs a command signal (access request) and an address signal to receive a read data signal from the semiconductor memory MEM, and for the execution of the write operation of the semiconductor memory MEM, it outputs a command signal, an address signal, and a write data signal. Further, for the execution of an access operation (a read operation, a program operation, or an erasure operation) of the FLASH, the CPU outputs a command signal, an address signal, and a write data signal to the FLASH, or receives a read data signal from the FLASH.

The memory controller MCNT outputs the command signal CMD, the address signal AD, and the write data signal DQ to the semiconductor memory MEM based on the command signal, the address signal, and the write data signal received from the CPU, and outputs to the CPU the read data signal DQ received from the semiconductor memory MEM. The memory controller FCNT operates in the same manner as the memory controller MCNT except that it outputs the address signal received from the CPU to a data line DT and receives a busy signal BSY from the flash memory FLASH. Incidentally, without the memory controller MCNT provided in the system SYS, the command signal CMD and the address signal AD for the execution of the read operation and the write operation of the semiconductor memory MEM may be output from the CPU directly to the semiconductor memory MEM.

FIG. 6 illustrates operations of clock cycles CLK1-20 in the semiconductor memory MEM illustrated in FIG. 1. In this example, the burst length BL1 is set to "1". In the normal operation mode NRM (user mode) in which the CPU illustrated in FIG. 5 or the like accesses the semiconductor memory MEM, the bank BK0 or BK1 selected according to the bank address signal BA supplied along with the active command ACT is activated and a word line is selected according to the row address signal RA ((a) of FIG. 6) as in a common SDRAM. According to the bank address signal BA supplied along with the write command WR, the bank BK0 or BK1 as a target of the write operation is selected, and write data DQ is written to a memory cell selected according to the column address signal CA ((b) of FIG. 6).

Further, according to the bank address signal BA supplied along with the read command RD, the bank BK0 or BK1 as a target of the read operation is selected, and read data DQ is output from a memory cell selected according to the column address signal CA ((c) of FIG. 6). In this manner, each of the banks BK0-1 is accessed independently during the normal operation mode NRM. In this embodiment, the write latency which is the number of clock cycles from the receipt of the write command WR up to the receipt of the write data is set to "1", and the read latency which is the number of clock cycles from the receipt of the read command RD up to the output of the read data is set to "2". Each of the banks BK0-1 is inactivated independently when a precharge command PRE is supplied ((d) of FIG. 6).

On the other hand, in the compression test mode TEST in which the semiconductor memory MEM is tested by the LSI tester TEST illustrated in FIG. 4 or the like, according to the value of the forced redundancy bit JR (forced redundancy signal) supplied to the bank address terminal BA along with the active command ACT, a normal compression test or a forced redundancy compression test is executed. Here, the compression test is a test in which one write data signal is written to the memory cells MC or RMC having different addresses in order to shorten the test time. In the compression test of this embodiment, the banks BK0-1 are both activated in response to the active command ACT and common write data is written simultaneously to the banks BK0-1. Therefore, the bank address signal BA is not necessary. The entry to the compression test mode TEST is initiated by the setting of the test register of the mode register 16. Resetting the test register causes the exit from the compression test mode TEST and the return to the normal operation mode NRM.

When the forced redundancy bit JR with low level L is supplied to the bank address terminal BA along with the active command ACT (TEST(JR=L)), the normal compression test is executed ((e) of FIG. 6). The compression test is executed in the manufacturing process (test process) of the semiconductor memory MEM before the program unit 24 is programmed. Therefore, in the normal compression test, only the real word lines WL are selected (the redundancy word lines RWL are not selected), and the real memory cells MC of the banks BK0-1 are accessed simultaneously. In a read operation in the compression test, in order to prevent the conflict of read data, the data input/output unit 30 outputs read data D0, D1 separately from the banks BK0-1 according to the bank address signal BA supplied along with the read command RD ((f) of FIG. 6).

When the forced redundancy bit JR with high level H (first level) is supplied to the bank address terminal BA along with the active command ACT (TEST(JR=H)), the forced redundancy compression test is executed ((g) of FIG. 6). In the forced redundancy compression test, the redundancy word lines RWL of the banks BK0-1 are forcibly selected simultaneously irrespective of the value of the row address signal AD0-10 supplied along with the active command ACT and the redundancy memory cells RMC are accessed as described above. The oblique lines illustrated in the waveform of the address signal AD0-10 indicate that the row address signal RA is masked. In a read operation in the forced redundancy compression test as well, the data input/output unit 30 reads data from the redundancy memory cells RMC according to the bank address signal BA supplied along with the read command RD and outputs read data D0, D1 separately from the banks BK0-1 ((h)) of FIG. 6). This may reduce the conflict of the read data.

The LSI tester TEST illustrated in FIG. 4 compares the read data D0, D1 with the expected value (write data) and detects a defect of the redundancy circuits such as the redundancy memory cells RMC or the redundancy word lines RWL. That is, the test of the redundancy circuits such as the redundancy memory cells RMC is executed and the semiconductor memory MEM is manufactured. Incidentally, when the same word line WL is accessed in the write operation and the read operation, the precharge command PRE is not necessary between the write command WR and the read command RD.

In the compression test, by judging whether to execute the forced redundancy test by using the bank address signal BA not used, the redundancy word lines RWL may forcibly select without using a dedicated terminal. Since, during the compression test mode, it is judged whether to execute the forced redundancy test or not only when the active command ACT is supplied, the forced redundancy test is not executed by mistake during the normal operation mode. That is, a malfunction of the semiconductor memory MEM may be reduced.

Note that in FIG. 6, for easier understanding of the description, the supply timings of major commands during the compression test mode are the same as those during the normal operation mode. However, in the compression test, the supply frequency of the active command ACT and the write command WR may be reduced to a half the supply frequency in the normal operation mode. Therefore, in an actual test, the time between the write and read of data to/from the memory cells MC may be made shorter than that in the normal operation mode. That is, not only the test time of the normal compression test testing the real memory cells MC but also the test time of the forced redundancy compression test testing the redundancy memory cells RMC may shorten.

As described above, in this embodiment, during the compression test mode, by supplying the forced redundancy signal JR to the bank address terminal BA not used in the active operation, the redundancy memory cells RMC of the plural banks BK0-1 may simultaneously test without providing any special terminal. As a result, the operation test of the redundancy memory cells RMC may efficiently execute before a defect is relieved, which may shorten the test time.

Figure 7:
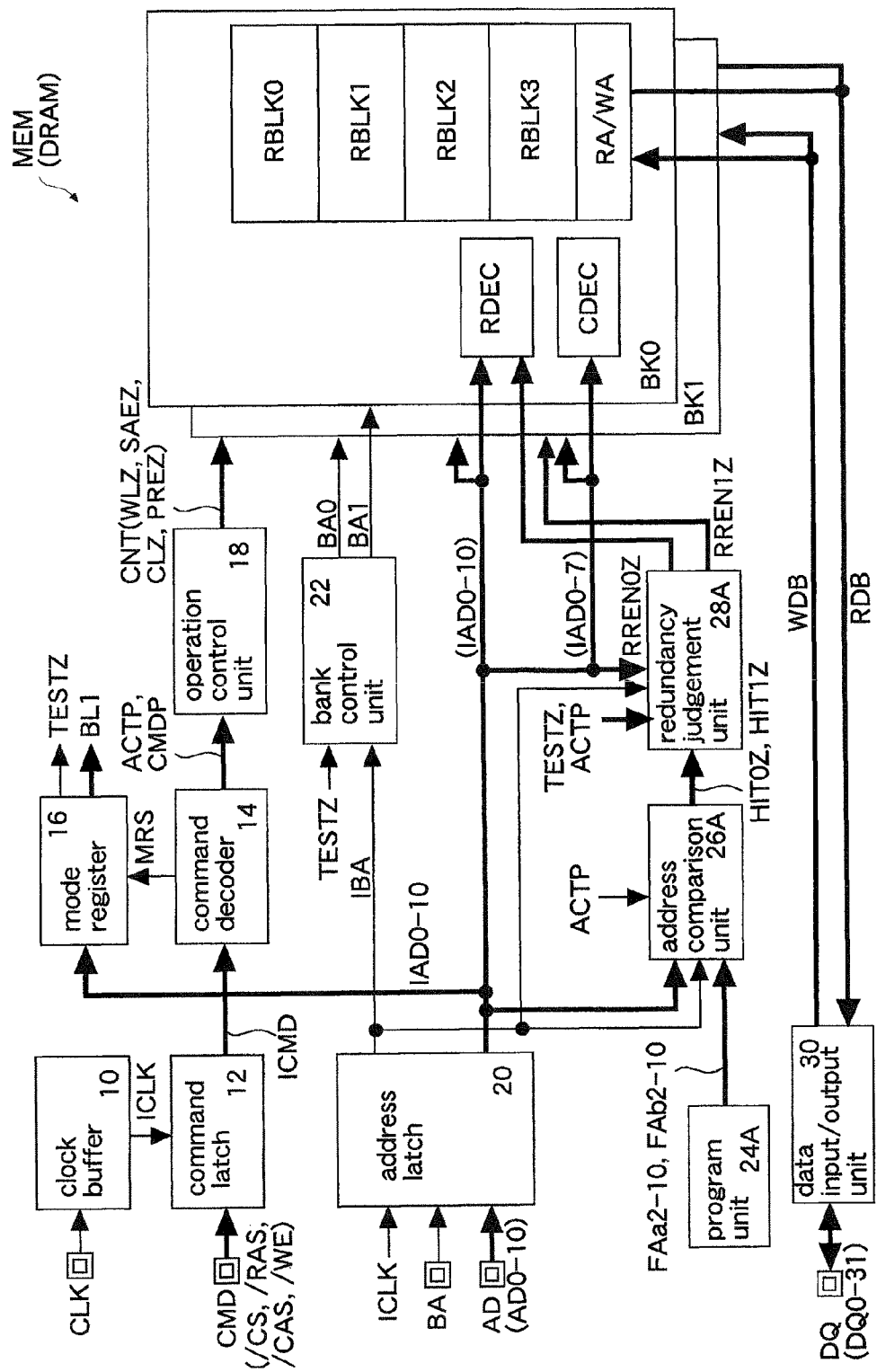
FIG. 7 illustrates another embodiment.
Figure 10:
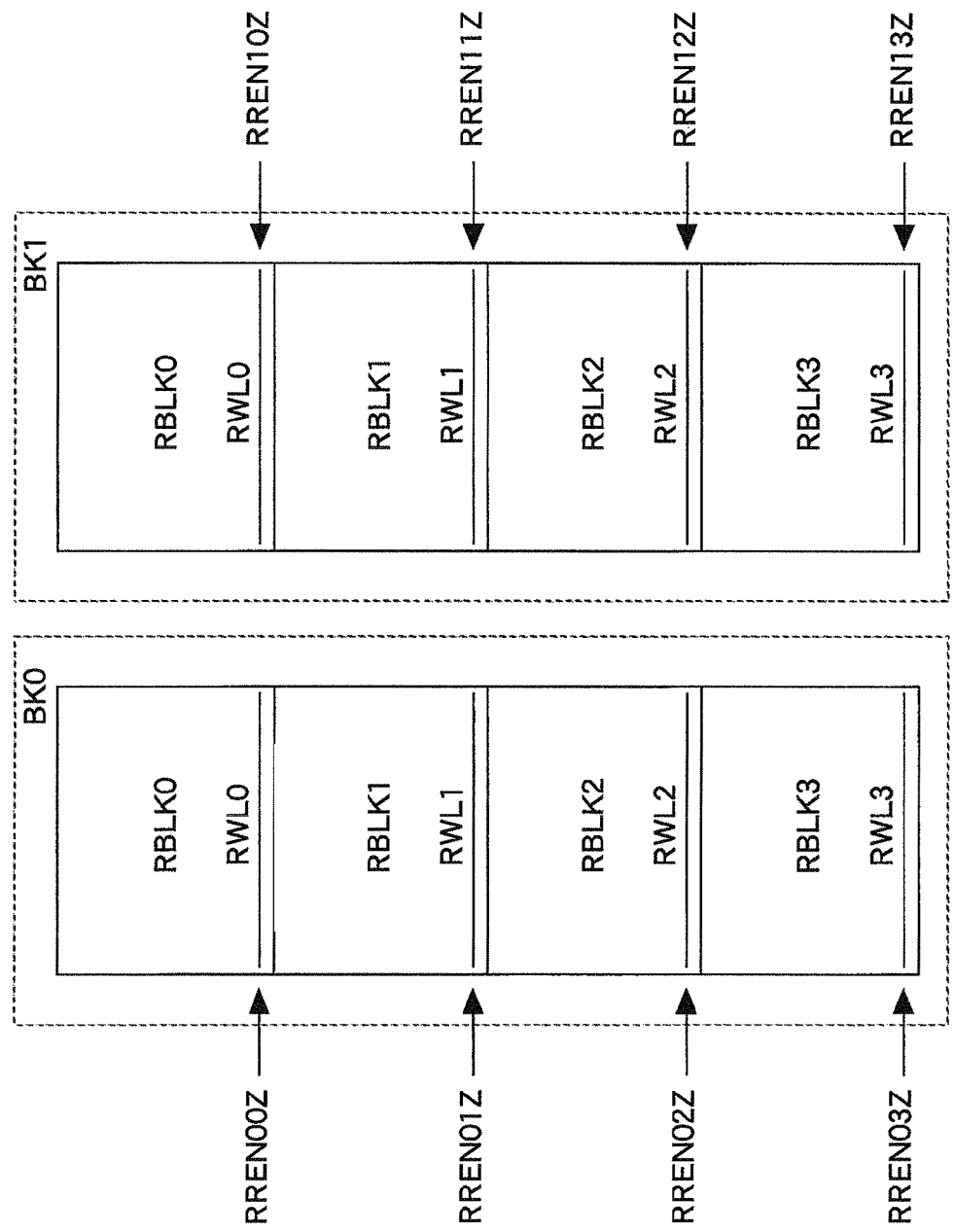
FIG. 10 illustrates an outline of banks illustrated in FIG. 7.

FIG. 7 illustrates another embodiment. The same elements as the elements described in the above-described embodiment will be denoted by the same reference numerals and symbols and a detailed description thereof will be omitted. In this embodiment, banks BK0-1 each have four row blocks RBLK0-3. The row blocks RBLK0-3 have the same configuration as that of the row blocks RBLK in FIG. 1, and have redundancy word lines RWL as illustrated in FIG. 10. Since the plural redundancy word lines RWL are provided in each of the banks BK0-1, a semiconductor memory MEM has a program unit 24A, an address comparison unit 26A, and a redundancy judgment unit 28A instead of the program unit 24, the address comparison unit 26, and the redundancy judgment unit 28 in FIG. 1. The other configuration is the same as that in FIG. 1. That is, the semiconductor memory MEM is a DRAM.

The program unit 24A stores four defect addresses for each of the banks BK0-1 and outputs each of them as a fuse row address signal FAa2-10 (or FAb2-10). In the signal names, "a" corresponds to the bank BK0 and "b" corresponds to the bank BK1. Since a two-bit address signal AD0-1 serves to specify one of the row blocks RBLK0-3, these two bits are not programmed in the program unit 24A.

The address comparison unit 26A outputs four hit signals HIT0Z (or HIT1Z) for each of the banks BK0-1. In the signal names, "0" corresponds to the bank BK0 and "1" corresponds to the bank BK1. The redundancy judgment unit 28A outputs four redundancy enable signals RREN0Z (or RREN1Z) for each of the banks BK0-1.

Figure 8:
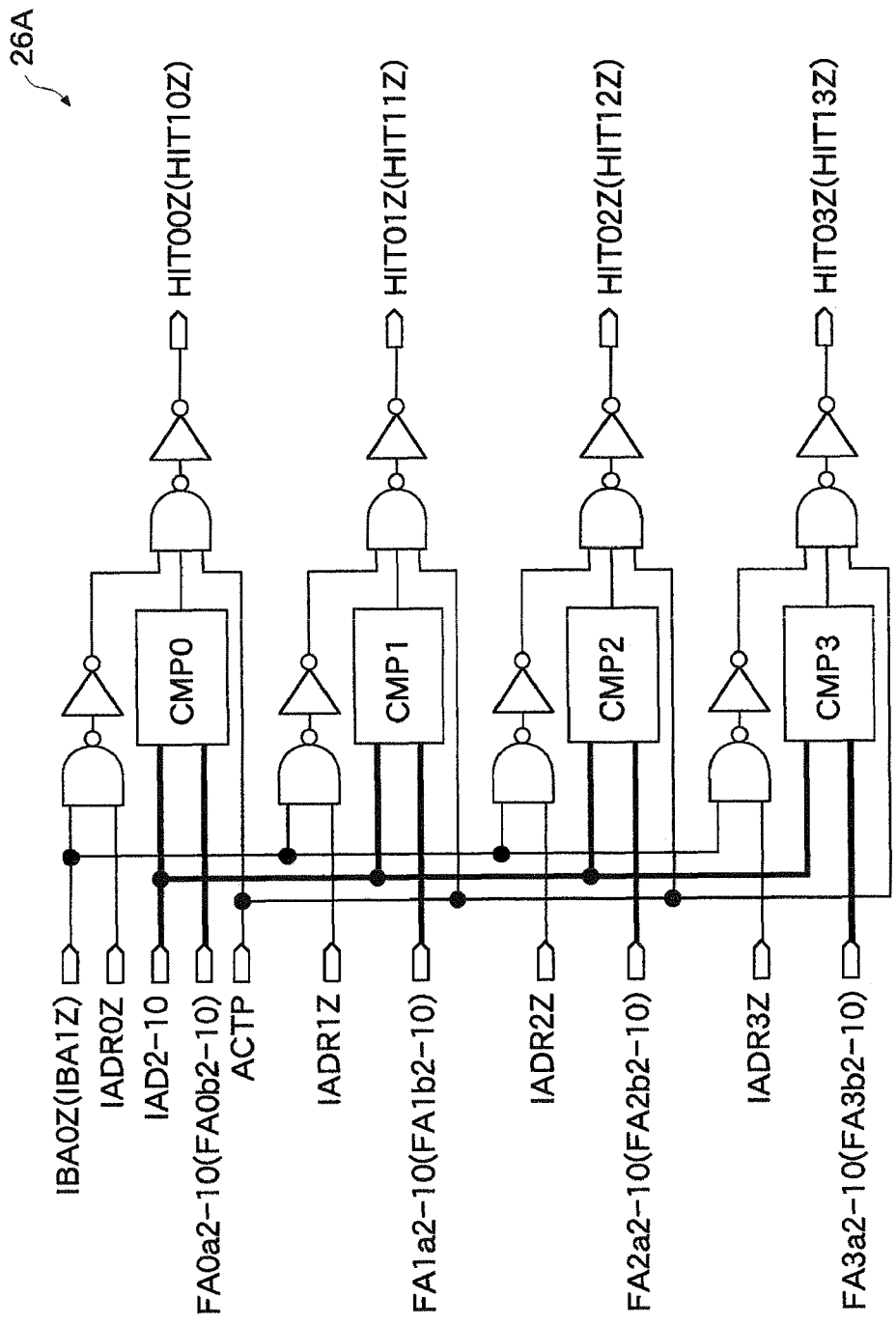
FIG. 8 illustrates details of an address comparison unit illustrated in FIG. 7.

FIG. 8 illustrates details of the address comparison unit 26A illustrated in FIG. 7. In FIG. 8, the address comparison unit 26A corresponding to the bank BK0 is illustrated. Signals used in the address comparison unit 26A corresponding to the bank BK1 are parenthesized in the drawing.

The basic configuration of the address comparison unit 26A is the same as that of the address comparison unit 26 illustrated in FIG. 2 except that its address comparison circuits CMP0-3 each compare a 9-bit row address, and input signals of its 3-input NAND gates include logics of row block address signals IADR0Z-IADR3Z respectively. A fuse row address signal (redundancy address signal) FA0a2-10 indicates a defect address of the row block RBLK0 of the bank BK0. Similarly, fuse row address signals FA1a2-10, FA2a2-10, FA3a2-10 indicate defect addresses of the row blocks RBLK1-3 of the bank BK0 respectively. The same applies to fuse row address signals FA0b2-10, FA1b2-10, FA2b2-10, FA3b2-10 corresponding to the bank BK1.

The row block address signal IADR0Z changes to high level when a row address signal AD0-1 indicates the row block RBLK0 (="00"). Similarly, the row block address signals IADR1Z-IADR3Z change to high level when the row address signal AD0-1 indicates the row blocks RBLK1-3 respectively. A hit signal HIT00Z is activated when the redundancy word line RWL of the row block RBLK0 of the bank BK0 is to be selected. Similarly, hit signals HIT01Z-HIT03Z are activated when the redundancy word lines RWL of the row blocks RBLK1-3 of the bank BK0 are to be selected. The same applies to hit signals HIT10Z-HIT13Z corresponding to the bank BK1.

Figure 9:
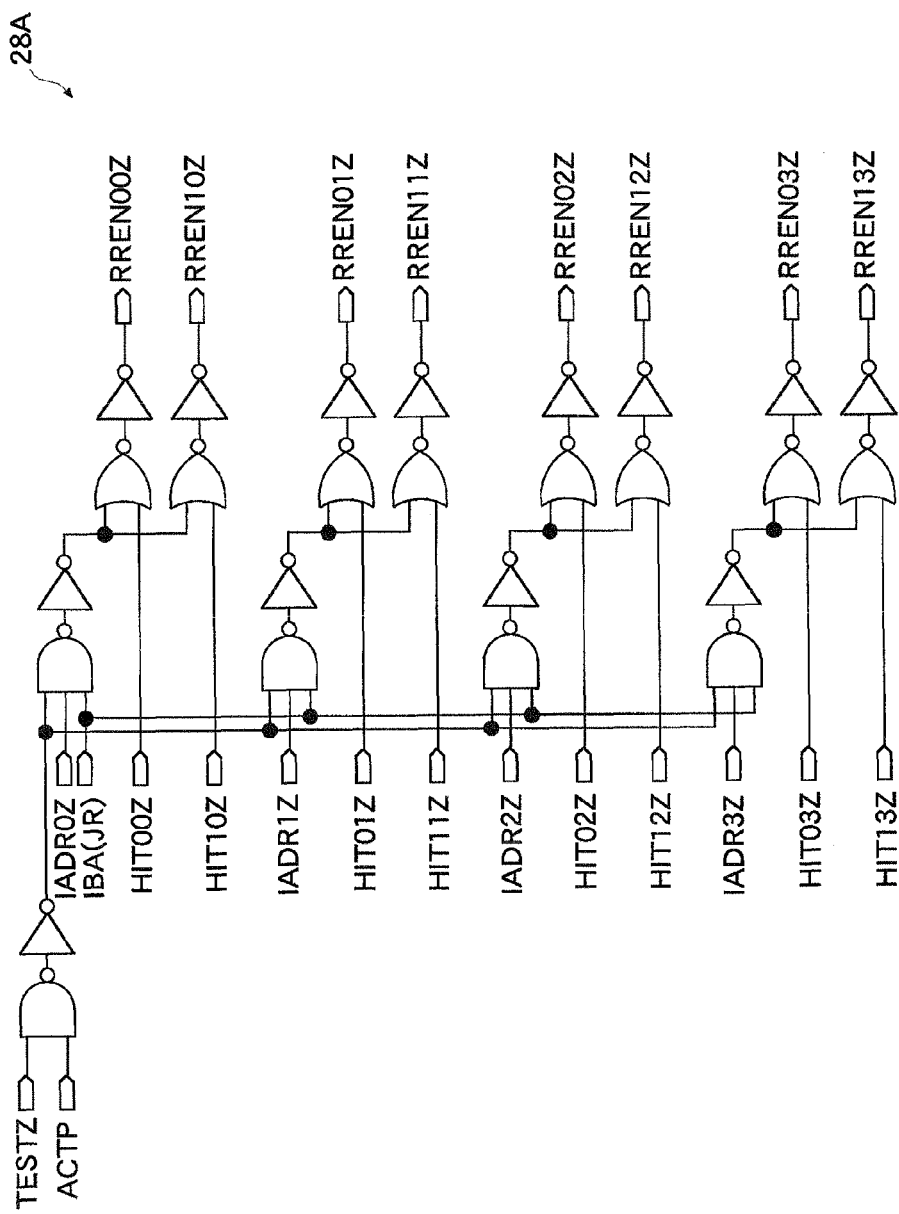
FIG. 9 illustrates details of a redundancy judgment unit illustrated in FIG. 7.

FIG. 9 illustrates details of the redundancy judgment unit 28A illustrated in FIG. 7. The redundancy judgment unit 28A outputs four redundancy enable signals RREN00-03Z (or RREN10-13Z) for each of the banks BK0-1. Therefore, the redundancy judgment unit 28A has a circuit scale corresponding to about four pieces of the redundancy judgment units 28 illustrated in FIG. 2. However, each NOR gate of the redundancy judgment unit 28A receives input signals including logic of one of the row block address signals IADR0Z-IADR3Z so as to specify one of the row blocks RBLK0-3.

During a compression test mode, when a high-level bank address signal IBA (forced redundancy signal JR) is supplied in response to an active command, a pair of the redundancy enable signals RRENZ (for example, RREN00Z and RREN10Z) corresponding to a high-level signal among the row block address signals IADR0Z-IADR3Z are simultaneously activated. That is, the redundancy word lines RWL of the banks BK0-1 are forcibly selected simultaneously.

FIG. 10 illustrates an outline of the banks BK0-1 illustrated in FIG. 7. The row blocks RBLK0-3 of each of the banks BK0-1 have the redundancy word lines RWL0-3 selected based on the redundancy enable signals RREN00Z-03Z (or RREN10Z-13Z) respectively. As illustrated in later-described FIG. 11, when the high-level bank address signal IBA (forced redundancy signal JR) is supplied along with the active command ACT during the compression test mode, a pair of the redundancy enable signals RRENZ (for example, RREN00Z and RREN10Z) of the now blocks RBLK with the same number (for example, RBLK0) in the banks BK0-1 are simultaneously activated, and the redundancy word lines RWL (for example, RWL0) of the banks BK0-1 are simultaneously selected.

Figure 11:
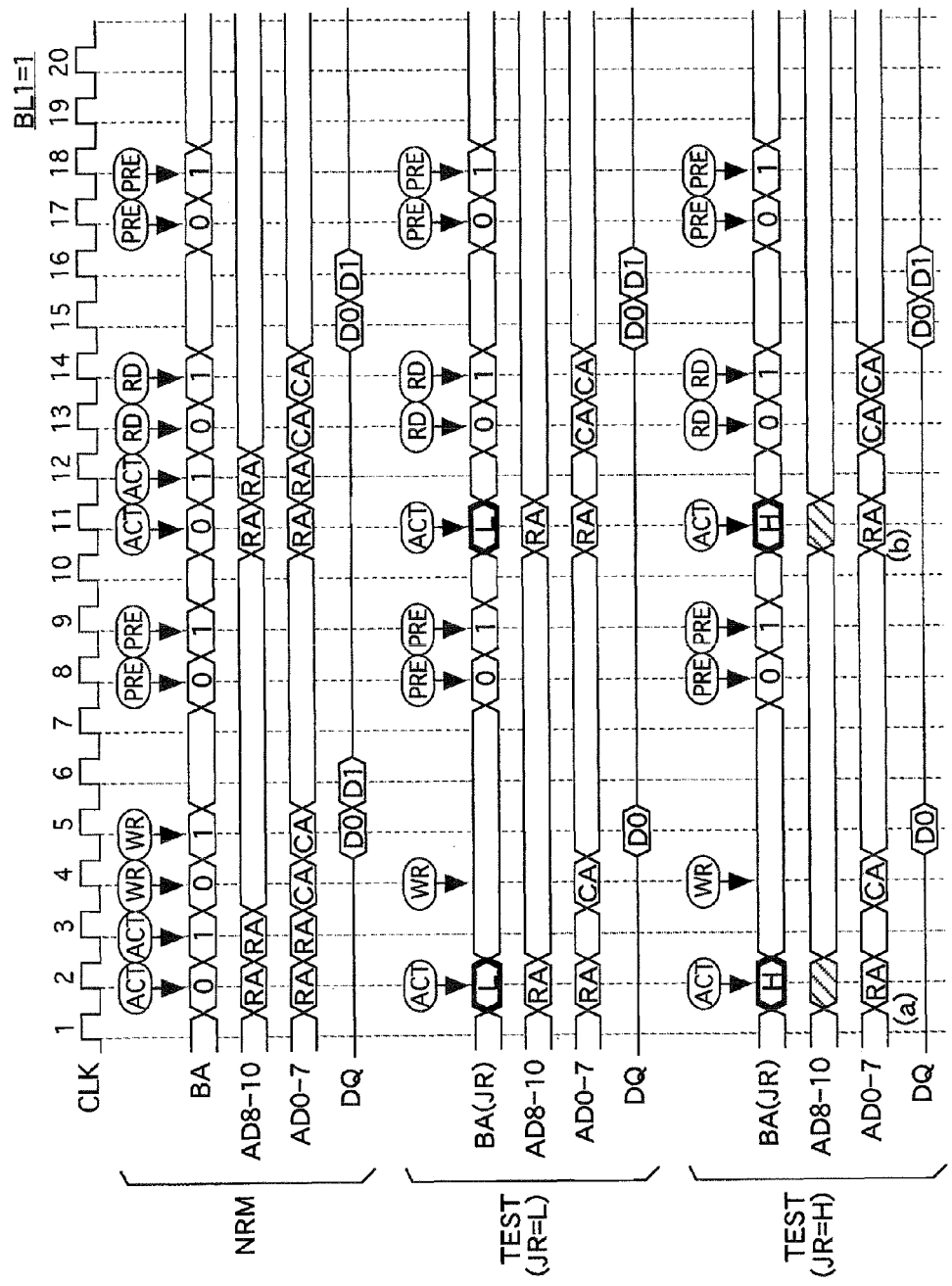
FIG. 11 illustrates operations of a memory illustrated in FIG. 7.

FIG. 11 illustrates operations of clock cycles CLK1-20 in the semiconductor memory MEM illustrated in FIG. 7. A detailed description of the same operations as those in FIG. 6 will be omitted. Operations in a normal operation mode NRM and operations (TEST(JR=L)) in a normal compression test (JR=L) during the compression test mode TEST are the same as those in FIG. 6.

In a forced redundancy compression test (TEST(JR=H)) executed when the forced redundancy bit JR has high level H (first level), the row address signal RA (AD0-1) is supplied to the semiconductor memory MEM so that one of the row blocks RBLK0-3 whose redundancy word lines RWL are to be forcibly activated is selected (((a) and (b) of FIG. 11). Operations in response to the signals other than the active command ACT are the same as the operations in the normal compression test.

As described above, in this embodiment, it may obtain the same effect as that of the above-described embodiment. In addition, in this embodiment, the test time of the forced redundancy compression test testing redundancy memory cells RMC may be shortened, also when the banks BK0-1 each have the plural row blocks RBLK0-3 including the redundancy word lines RWL0-3.

Figure 12:
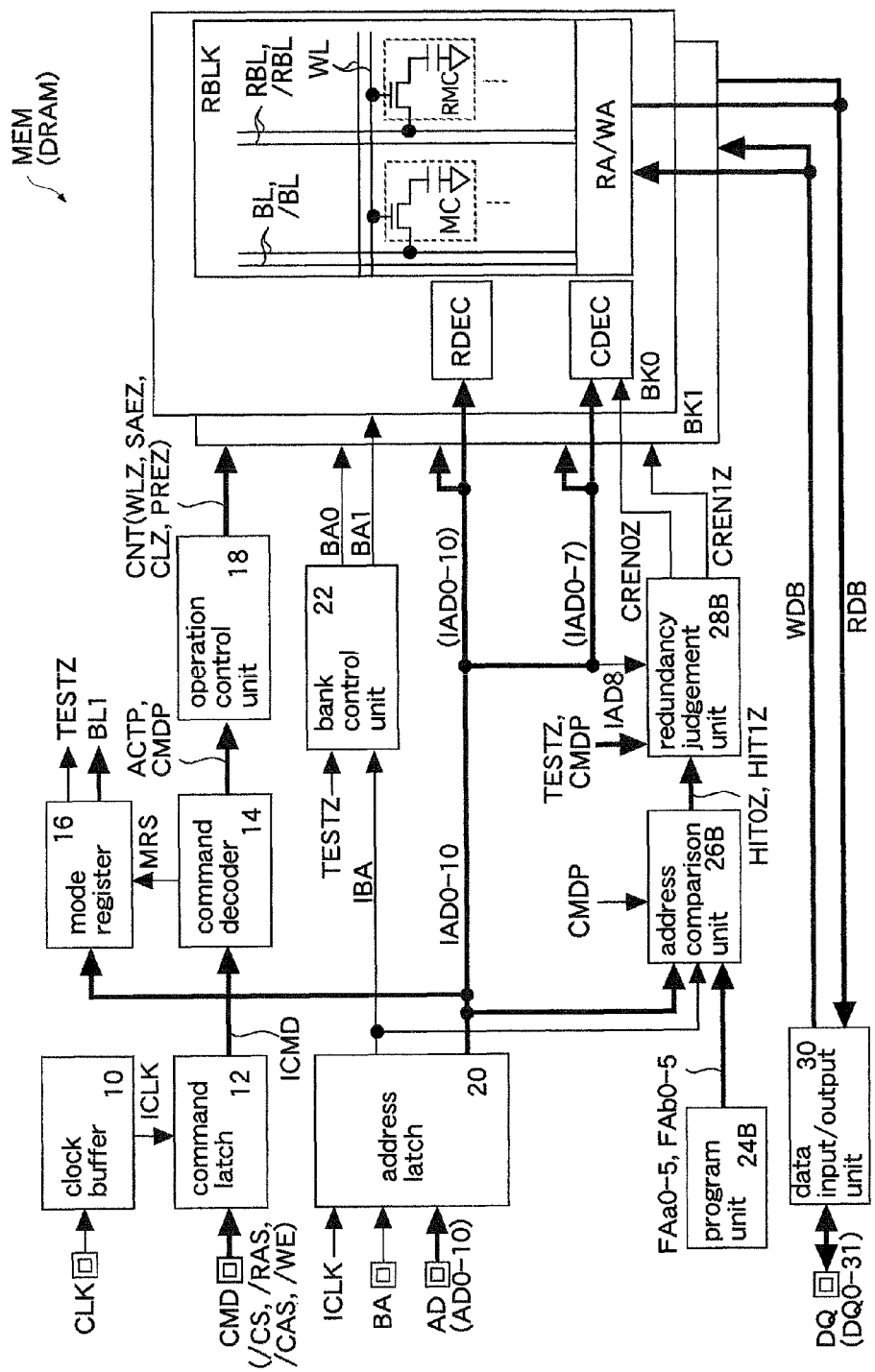
FIG. 12 illustrates another embodiment.

FIG. 12 illustrates another embodiment. The same elements as the elements described in the above-described embodiments will be denoted by the same reference numerals and symbols and a detailed description thereof will be omitted. In this embodiment, banks BK0-1 each have a row block RBLK including a redundancy bit line pair RBL, /RBL. In order to select the redundancy bit line pairs RBL, /RBL, a semiconductor memory MEM has a program unit 24B, an address comparison unit 26B, and a redundancy judgment unit 28B instead of the program unit 24, the address comparison unit 26, and the redundancy judgment unit 28 in FIG. 1. The other configuration is the same as that in FIG. 1 except that its row decoders RDEC and column decoders CDEC are partly different. That is, the semiconductor memory MEM is a DRAM.

The program unit 24B stores a column address signal indicating a bit line pair BL, /BL corresponding to a defect by programming its internal fuse and outputs the stored column address signal as fuse column address signals FAa0-5, FAb0-5 (redundancy address signals). The address signal FAa0-5 indicates a defect address of the bank BK0, and the address signal FAb0-5 indicates a defect address of the bank BK1. In this embodiment, the semiconductor memory MEM has column redundancy circuits (redundancy memory cells RMC, the redundancy bit line pairs RBL, /RBL, and the like) for relieving a defect on per bit line pair BL, /BL basis. Incidentally, the program circuit 24B may be formed by using a nonvolatile memory cell or the like.

The address comparison unit 26B compares an address AD0-5 (column address signal) supplied along with an access command (CMDP) and the redundancy address signals (fuse column address signals FAa0-5, FAb0-5) bit by bit, and when all the bit values match, activates one of hit signals HIT0Z, HIT1Z according to a bank address signal BA (IBA). The hit signal HIT0Z is output when the redundancy bit line pair RBL, /RBL of the bank BK0 is to be selected. The hit signal HIT1Z is output when the redundancy bit line pair RBL, /RBL of the bank BK1 is to be selected.

During a normal operation mode, the redundancy judgment unit 28B activates a redundancy enable signal CREN0Z (result of redundancy judgment) when the hit signal HIT0Z is active, and activates a redundancy enable signal CREN1Z (result of the redundancy judgment) when the hit signal HIT1Z is active. By the activation of the redundancy enable signal CREN0Z, the selection of a real bit line pair BL, /BL of the bank BK0 is prohibited and the selection of the redundancy bit line pair RBL, –RBL of the bank BK0 is permitted. By the activation of the redundancy enable signal CREN1Z, the selection of a real bit line pair BL, –BL of the bank BK1 is prohibited and the selection of the redundancy bit line pair RBL, –RBL of the bank BK0 is permitted. The permission/prohibition of the selection is controlled by, for example, ON/OFF of column switches. Consequently, the real bit lien pair BL, /BL corresponding to a defect is replaced by the redundancy bit line pair RBL, /RBL in each of the banks BK0-1, and the defect is relieved.

Further, during a test mode (TESTZ=high level), the redundancy judgment unit 28B activates both of the redundancy enable signals CREN0Z. CREN1Z when receiving high level (first level) of a column address signal IAD8 (forced redundancy signal; JC illustrated in FIG. 13). Consequently, during the test mode, the redundancy bit line pairs RBL, /RBL of the banks BK0-1 are simultaneously selected.

The row blocks RBLK each have a plurality of dynamic memory cells MC arranged in matrix, the plural bit line pairs BL, /BL each coupled to an array of the memory cells MC arranged in a vertical direction in FIG. 12, the redundancy bit line pair RBL, /RBL coupled to an array of redundancy memory cells RMC arranged in the vertical direction in FIG. 12, and a plurality of word lines WL each coupled to an array of the memory cells MC, RMC arranged in a lateral direction in FIG. 12. The real memory cells MC and the redundancy memory cells RMC are selected by the column switches that turn on according to the operation of the column decoders CDEC.

Figure 13:
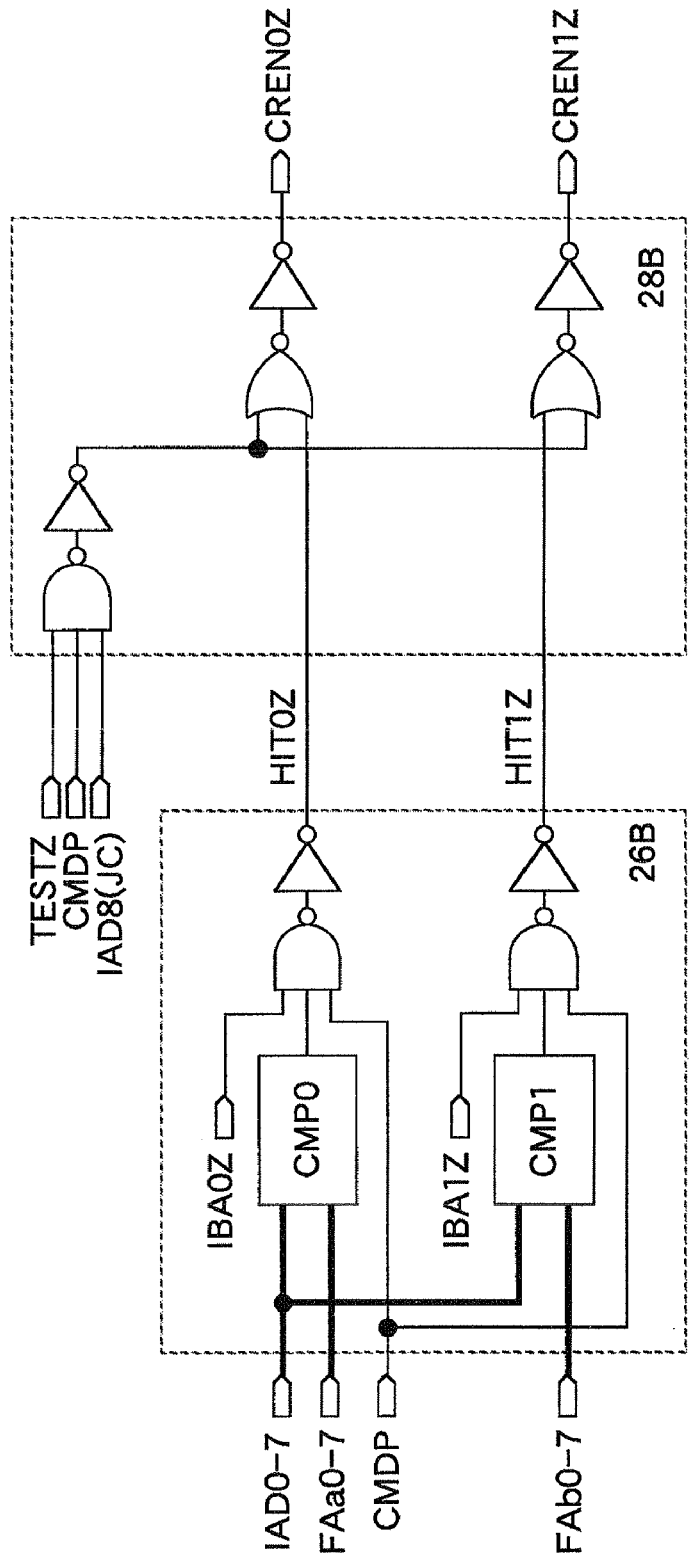
FIG. 13 illustrates details of an address comparison unit and a redundancy judgment unit illustrated in FIG. 12.

FIG. 13 illustrates details of the address comparison unit 26B and the redundancy judgment unit 28B illustrated in FIG. 12. The address comparison unit 26B is the same as the address comparison unit 26 illustrated in FIG. 2 except that the address signals IAD0-7, FA (FAa0-7, FAb0-7) received by its address comparison circuits CMP0. CMP1 are different and it outputs the hit signals HIT0Z-1Z in response to the access command CMDP.

The redundancy judgment unit 28B is the same as the redundancy judgment unit 28B illustrated in FIG. 2 except that the redundancy enable signals CREN0Z. CREN1Z are simultaneously activated during a compression test mode according to the address signal IAD8 (forced redundancy bit JC) instead of the bank address signal BA (forced redundancy bit JR).

Figure 14:
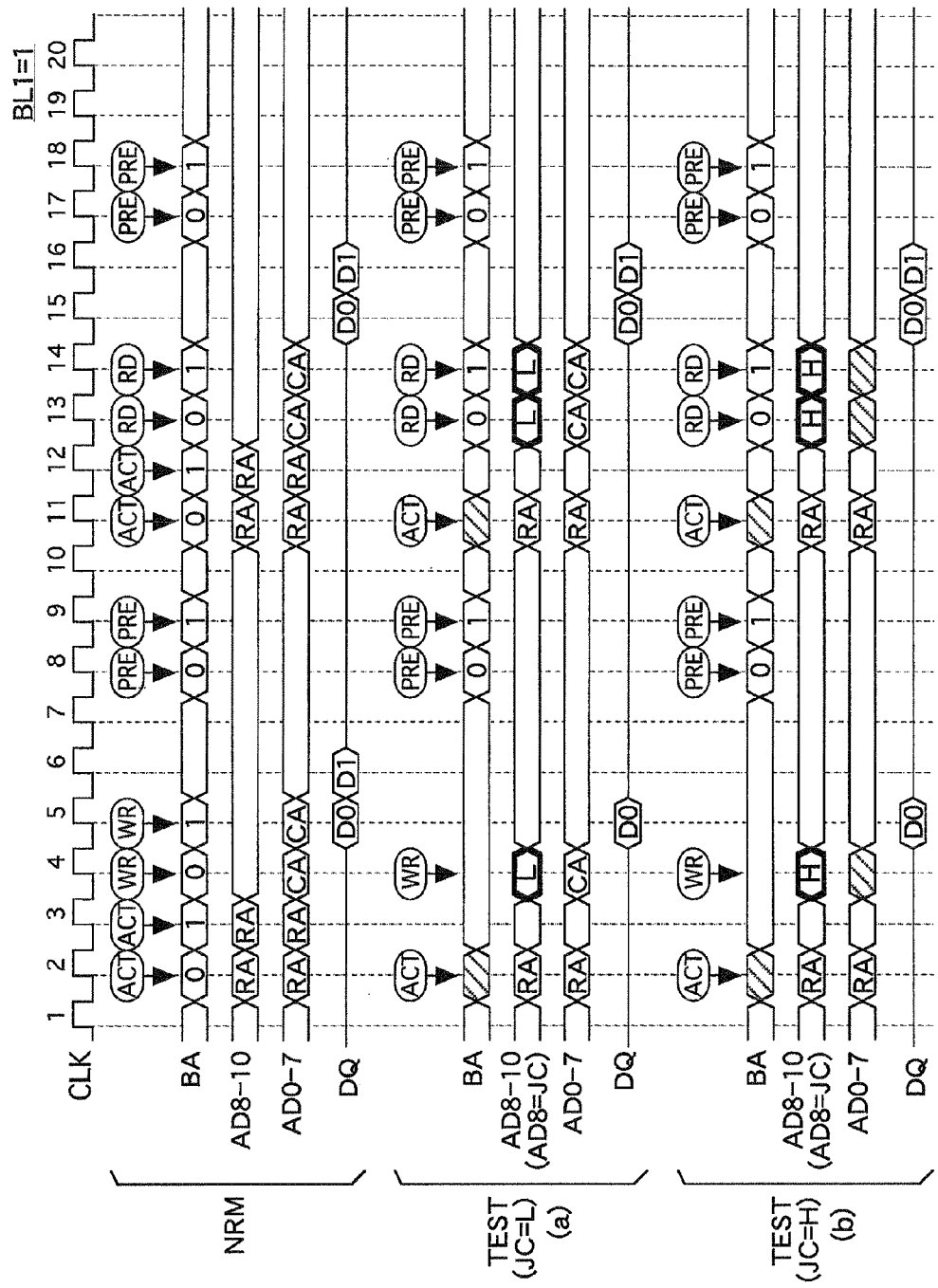
FIG. 14 illustrates operations of a memory illustrated in FIG. 7.

FIG. 14 illustrates operations of clock cycles CLK1-20 in the semiconductor memory MEM illustrated in FIG. 7. A detailed description of the same operations as those in FIG. 6 will be omitted. Operations in a normal operation mode NRM are the same as those in FIG. 6. In the compression test mode TEST, a normal compression test or a forced redundancy compression test is executed according to a value of the forced redundancy bit JC (forced redundancy signal) supplied to an address terminal AD8 along with a write command WR and a read command RD.

In this embodiment, part of a row address signal RA is supplied to part of an external address terminal AD (AD8-10), and the rest of the row address signal RA and a column address signal CA are supplied to the rest of the external address terminal AD (AD0-7) at different timings. The forced redundancy signal JC is supplied to the external address terminal AD8 in response to the write command WR or the read command RD. In the compression test, common write data is written to the banks BK0-1 simultaneously. Therefore, a bank address signal BA is not necessary.

When the forced redundancy bit JC with low level L is supplied to the address terminal AD8 along with the write command WR or the read command RD (TEST(JC=L)), the normal compression test is executed (a)) of FIG. 14). The compression test is executed in a manufacturing process (test process) of the semiconductor memory MEM before the program unit 24B is programmed. Therefore, in the normal compression test, only the real bit line pairs BL, /BL are selected (the redundancy bit line pairs RBL, /RBL are not selected), and the real memory cells MC of the banks BK0-1 are simultaneously accessed. As in FIG. 6, in a read operation of the compression test, in order to prevent the conflict of read data, the bank address signal BA is supplied along with the read command RD, and read data D0, D1 are output separately from the banks BK0-1.

When the forced redundancy bit JC with high level H is supplied to the address terminal AD8 along with the write command WR or the read command RD (TEST(JC=H)), the forced redundancy compression test is executed ((b) of FIG. 14). In the forced redundancy compression test, the redundancy bit line pairs RBL, /RBL of the banks BL0-1 are forcibly selected irrespective of the value of the column address signal AD0-7 supplied along with the write command WR or the read command RD and the redundancy memory cells RMC are accessed, as described above. The oblique lines illustrated in the waveforms of the address signals AD0-7 and the bank address signal BA indicate that the address signals AD0-7, BA are masked.

In the compression test, by judging whether to execute the forced redundancy test or not by using the address signal AD8 not used, the redundancy bit line pairs RBL, /RBL may forcibly select without using a dedicated terminal. Since, during the compression test mode, whether to execute the forced redundancy test or not is judged only when the write command WR is supplied and when the read command RD is supplied, the forced redundancy test is not executed by mistake during the normal operation mode. That is, a malfunction of the semiconductor memory MEM may be reduced. Incidentally, as in FIG. 6, in the compression test, the supply frequency of the active command ACT and the write command WR may be reduced to a half the supply frequency in the normal operation mode. In particular, the test time of the forced redundancy compression test testing the redundancy memory cells RMC may be shortened.

As described above, in this embodiment, the same effect as that of the above-described embodiments may be obtained. In particular, by supplying the forced redundancy signal JC to the address terminal AD8 not used in any of the write operation and the read operation, the redundancy memory cells RMC coupled to the redundancy bit lines RBL, /RBL of the plural banks 8K0-1 may simultaneously test without providing any special terminal. As a result, the test time of the operation test of the redundancy memory cells RMC before a defect is relived may be shortened.

Figure 15:
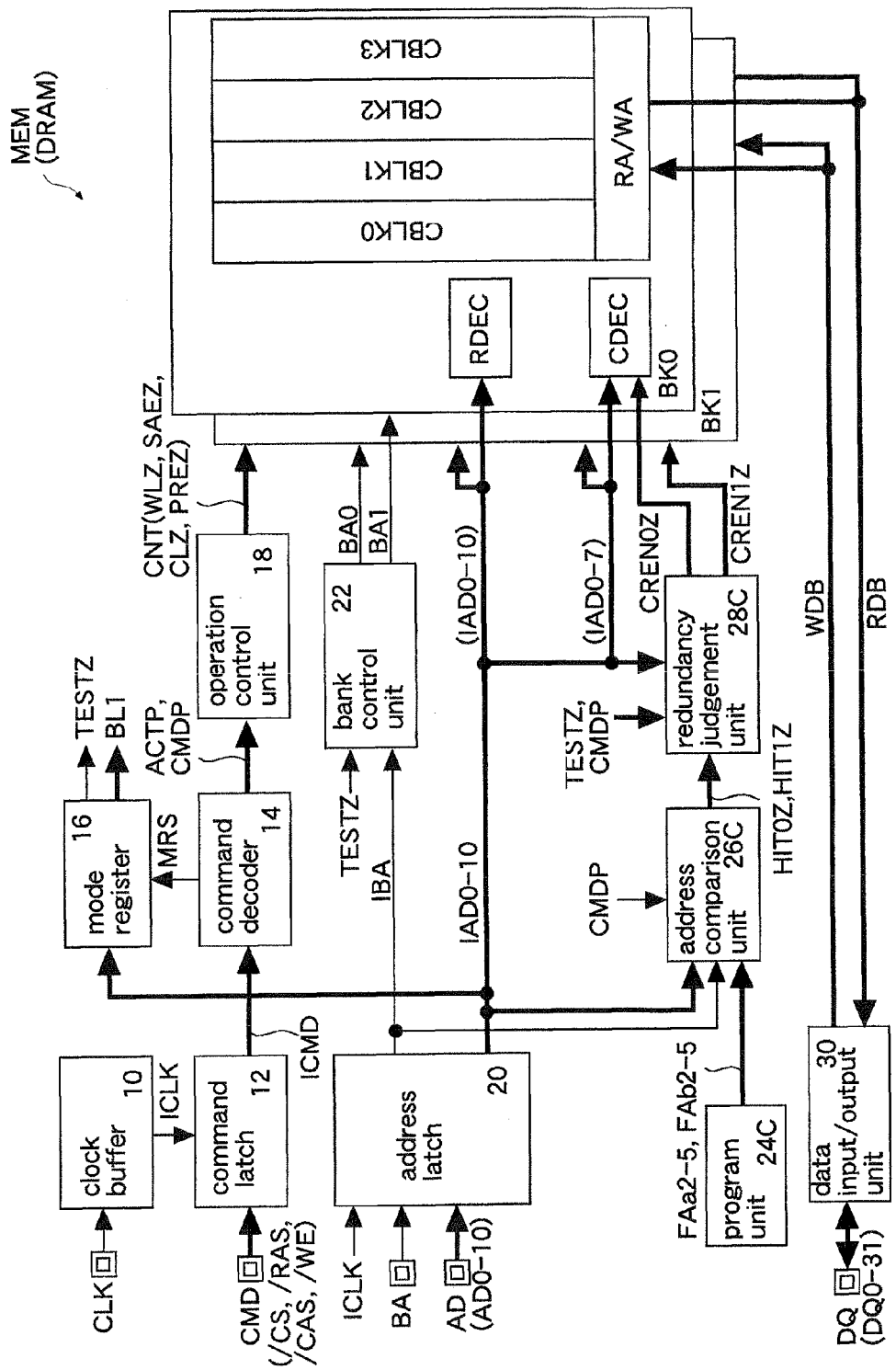
FIG. 15 illustrates another embodiment.

FIG. 15 illustrates another embodiment. The same elements as the elements described in the above-described embodiments will be denoted by the same reference numerals and symbols and a detailed description thereof will be omitted. In this embodiment, banks 8K0-1 each have four column blocks CBLK0-3. The column blocks CBLK0-3 each have a redundancy bit line pair RBL, /RBL similarly to the row blocks RBLk in FIG. 12. Since the plural bit line pairs RBL, /RBL are provided in each of the banks BK0-1, a semiconductor memory MEM has a program unit 24C, an address comparison unit 26C, and a redundancy judgment unit 28C instead of the program unit 24B, the address comparison unit 26B, and the redundancy judgment unit 28B in FIG. 12. The other configuration is the same as that in FIG. 12. That is, the semiconductor memory MEM is a DRAM.

The program unit 24C stores four defect addresses for each of the banks BK0-1 and outputs each of them as a fuse column address signal FAa2-5 (or FAb2-5). In the signal names, "a" corresponds to the bank BK0, and "b" corresponds to the bank 8K1. In this embodiment, since a two-bit address signal AD0-1 serves to specify one of the column blocks CBLK0-3, the two bits are not programmed in the program unit 24C.

The address comparison unit 26C outputs four hit signals HIT0Z (or HIT1Z) for each of the banks BK0-1. In the signal names, "0" corresponds to the bank BK0 and "1" corresponds to the bank BK1. The redundancy judgment unit 28C outputs four redundancy enable signals CREN0Z (or CREN1Z) for each of the banks BK0-1.

Figure 16:
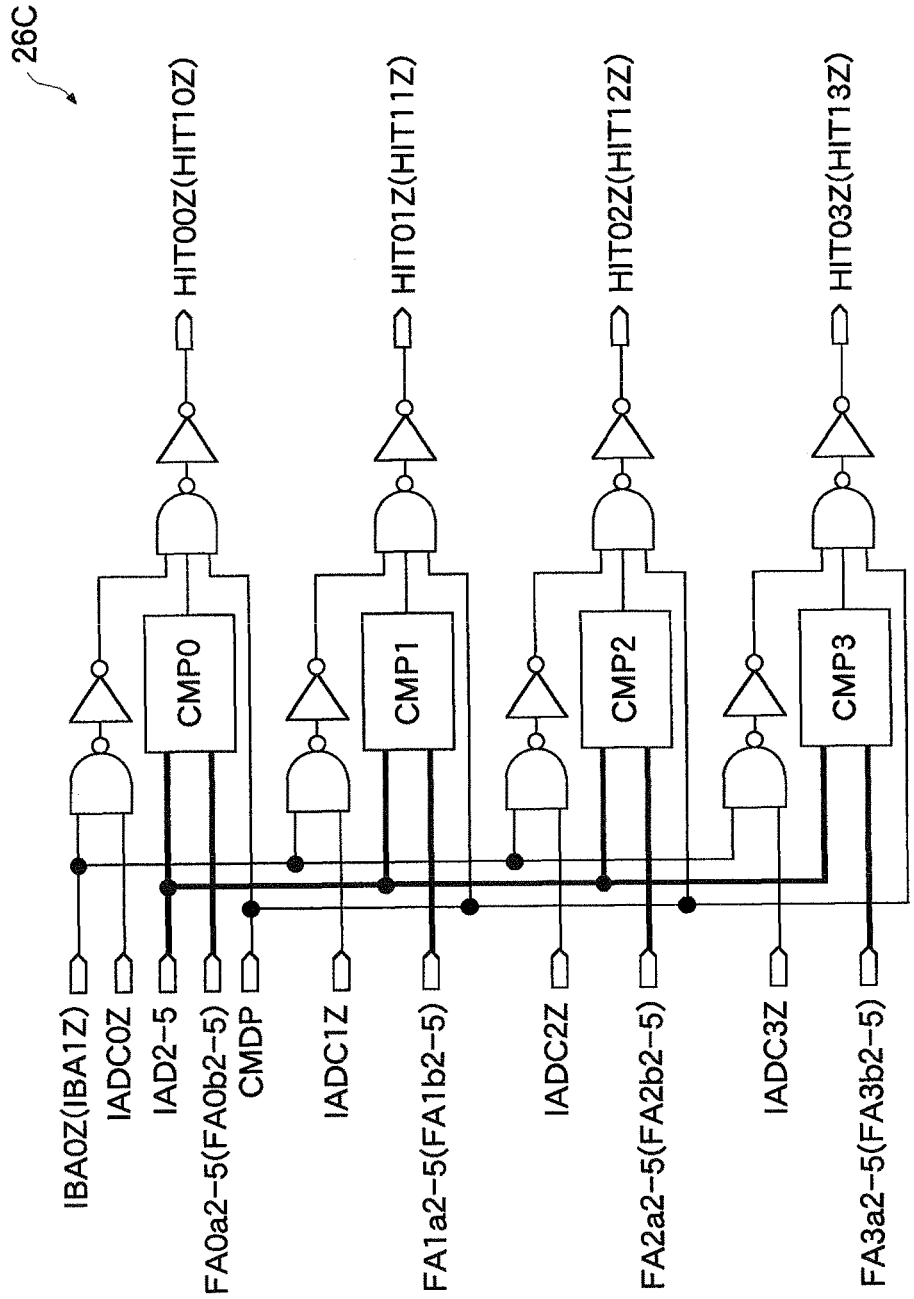
FIG. 16 illustrates details of an address comparison unit illustrated in FIG. 15.

FIG. 16 illustrates details of the address comparison unit 26C illustrated in FIG. 15. In FIG. 16, the address comparison unit 26C corresponding to the bank BK0 is illustrated. Signals used in the address comparison unit 26C corresponding to the bank BK1 are parenthesized in the drawing.

The basic configuration of the address comparison unit 26C is the same as that of the address comparison unit 26B illustrated in FIG. 13 except that its address comparison circuits CMP0-3 compare a four-bit column address, and input signals of its 3-input NAND gates include logics of column block address signals IADC0Z-IADC3Z. A fuse column address signal (redundancy address signal) FA0a2-5 indicates a defect address of the column block CBLK0 of the bank BK0. Similarly, fuse column address signals FA1a2-5, FA2a2-5, FA3a2-5 indicate defect addresses of the column blocks CBLK1-3 of the bank BK0 respectively. The same applies to fuse column address signals FA0b2-5, FA1b2-5, FA2b2-5, FA3b2-5 corresponding to the bank BK1.

The column block address signal IADC0Z changes to high level when a column address signal AD0-1 indicates the column block CBLK0 (="00"). Similarly, the column block address signals IADC1Z-IADC3Z change to high level when the column address signal AD0-1 indicates the column blocks CBLK1-3 respectively. A hit signal HIT00Z is activated when the redundancy bit line pair RBL, /RBL of the column block CBLK0 of the bank BK0 is to be selected. Similarly, hit signals HIT01Z-HIT03Z are activated when the redundancy bit line pairs RBL, /RBL of the column blocks CBLK1-3 of the bank BK0 are to be selected. The same applies to hit signals HIT10Z-HIT13Z corresponding to the bank BK1.

Figure 17:
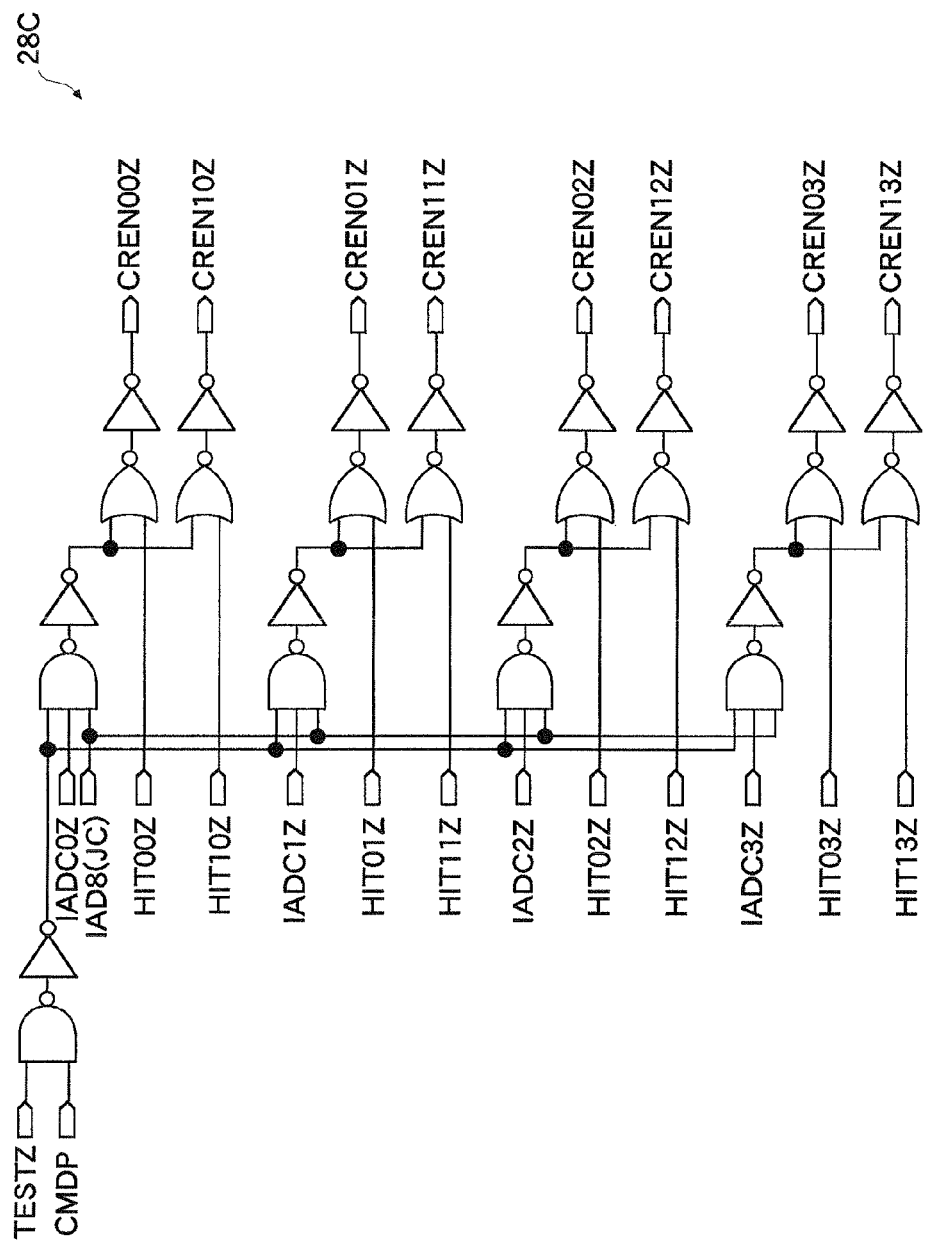
FIG. 17 illustrates details of a redundancy judgment unit illustrated in FIG. 15.

FIG. 17 illustrates details of the redundancy judgment unit 28C illustrated in FIG. 15. The redundancy judgment unit 28C outputs four redundancy enable signals CREN00-03Z (or CREN10-13Z) for each of the banks BK0-1. Therefore, the redundancy judgment unit 28C has a circuit scale corresponding to about four pieces of the redundancy judgment units 28B illustrated in FIG. 13. However, each NOR gate of the redundancy judgment unit 28C receives an input signal including logic of one of the column block address signals IADC0Z-IADC3Z in order to specify one of the column blocks CBLK0-3.

During a compression test mode, when a high-level address signal IAD8 (forced redundancy signal JC) is supplied in response to a write command or a read command, a pair of the redundancy enable signals CREN0Z-1Z (for example, CREN00Z and CREN10Z) corresponding to a high-level signal among the column block address signal IADC0Z-IADC3Z are simultaneously activated. That is, the redundancy bit line pairs RBL, /RBL of the banks BK0-1 are forcibly selected.

Figure 18:
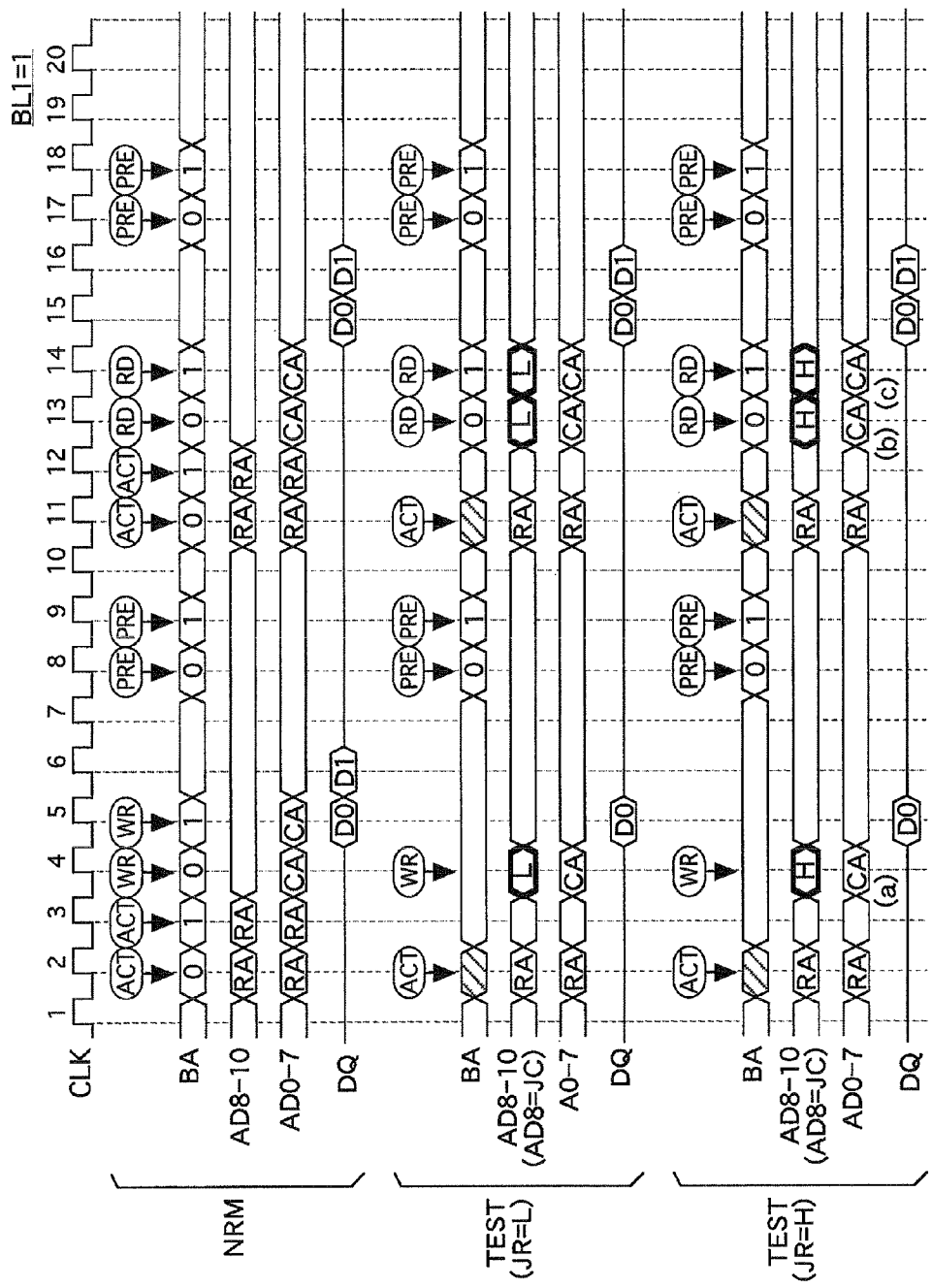
FIG. 18 illustrates operations of a memory illustrated in FIG. 15.

FIG. 18 illustrates operations of clock cycles CLK1-20 in the semiconductor memory MEM illustrated in FIG. 15. A detailed description of the same operations as those in FIG. 14 will be omitted. Operations in a normal operation mode NRM and operations in a normal compression test (TEST(JR=L)) during the compression test mode TEST are the same as those in FIG. 14.

In a forced redundancy compression test (TEST(JR=H)) executed when the forced redundancy bit JC has high level H, the column address signal CA (AD0-1) is supplied to the semiconductor memory MEM so that one of the column blocks CBLK0-3 whose redundancy bit line pairs RBL, /RBL are to be forcibly activated is selected ((a), (b), (c) of FIG. 18). The other operations are the same as those in FIG. 14.

As described above, in this embodiment, the same effect as that of the above-described embodiments may be obtained. In addition, in this embodiment, the test time of the forced redundancy compression test testing redundancy memory cells RMC may shorten also when the banks BK0-1 each have the plural column blocks CBLK0-3 each including the redundancy bit line pair RBL, /RBL.

Figure 19:
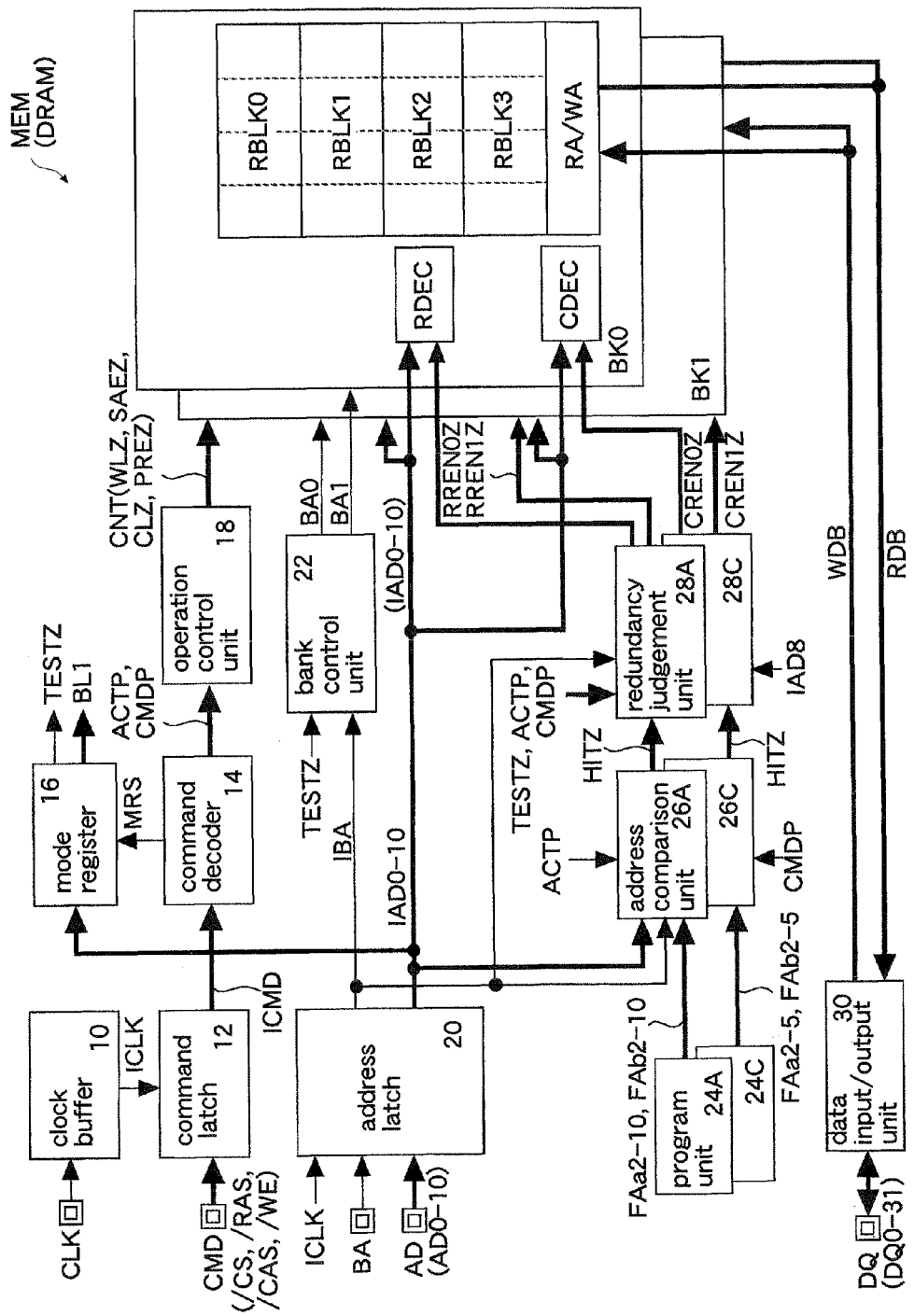
FIG. 19 illustrates another embodiment.

FIG. 19 illustrates another embodiment. The same elements as the elements described in the above-described embodiments will be denoted by the same reference numerals and symbols and a detailed description thereof will be omitted. In this embodiment, banks BK0-1 each have four row blocks RBLK0-3. The row blocks RBLK0-3 each are divided into four column blocks CBLK0-3 as illustrated by the broken lines in the drawing. That is, the row blocks RBLK0-3 each have a redundancy word line RWL and a redundancy bit line pair RBL, /RBL.

A semiconductor memory MEM has the program unit 24A, the address comparison unit 26A, and the redundancy judgment unit 28A illustrated in FIG. 7 in order to select the redundancy word line RWL of each of the row blocks RBLK0-3. Further, the semiconductor memory MEM has the program unit 24C, the address comparison unit 26C, and the redundancy judgment unit 28C illustrated in FIG. 15 in order to select the redundancy bit line pair RBL, /RBL of each of the column blocks CBLK0-3. The other configuration is the same as that in FIG. 1 except that its row decoders RDEC and column decoders CDEC are partly different. That is, the semiconductor memory MEM is a DRAM.

Figure 20:
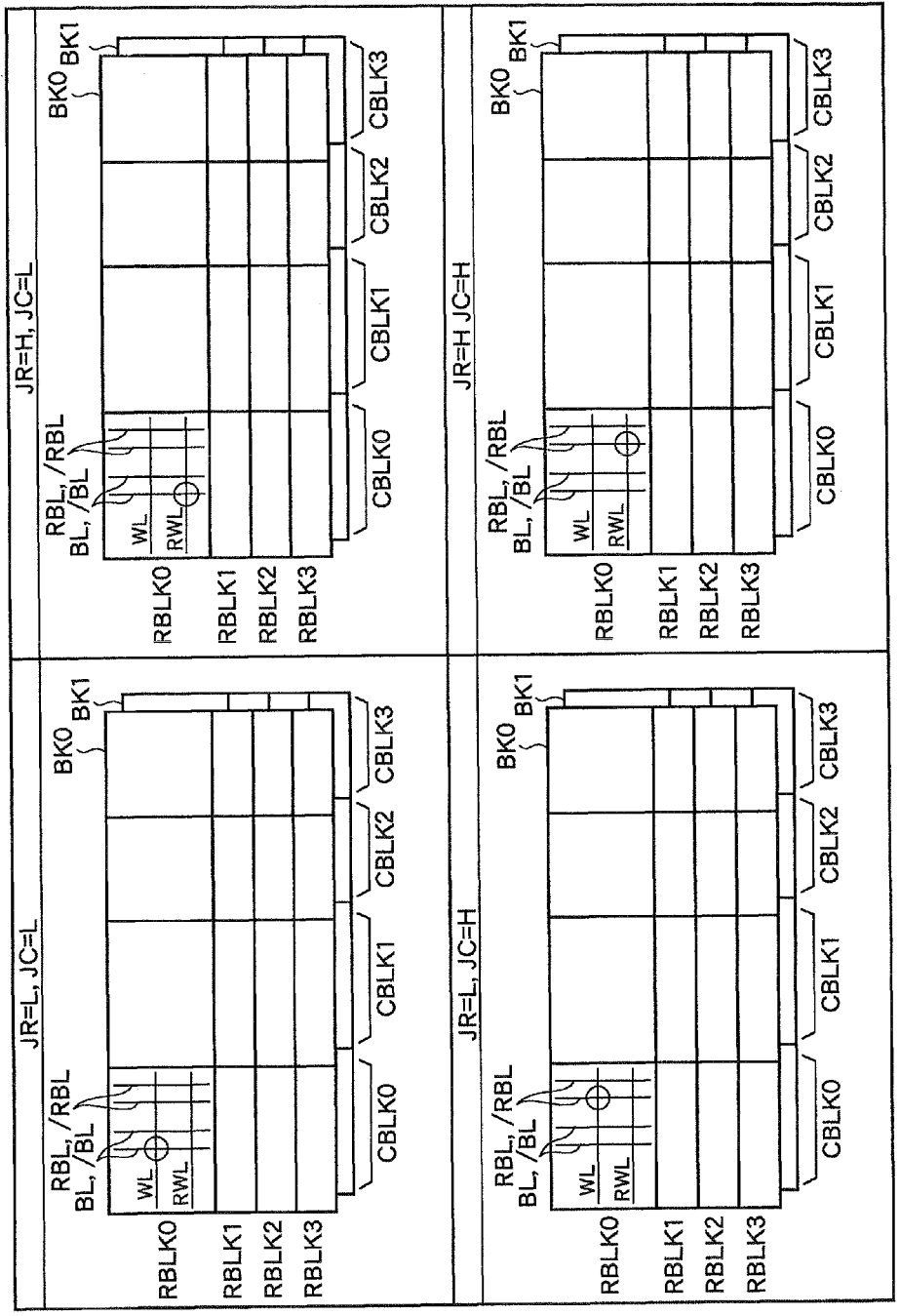
FIG. 20 illustrates an outline of a compression test of a memory illustrated in FIG. 19.

FIG. 20 illustrates an outline of a compression test of the semiconductor memory MEM illustrated in FIG. 19. In FIG. 20, an example where the column blocks CBLK0 in the row blocks RBLK0 of the banks BK0-1 are accessed is illustrated. In this embodiment, during a compression test mode TEST, a normal compression test or a forced redundancy compression test is executed according to a value of a forced redundancy bit JR supplied to a bank address terminal BA along with an active command ACT and a value of a forced redundancy bit JC supplied to an address terminal AD8 along with a write command WR or a read command RD. The circles in the drawing represent real memory cells MC or redundancy memory cells RMC that are to be accessed.

Concretely, when the forced redundancy bits JR, JC both have low level L (upper left in FIG. 20), a real word line WL and a real bit line pair BL, /BL are selected in each of the banks BK0-1. At this time, a real memory cell MC of the column block CBLK0 of each of the banks BK0-1 is accessed, and the normal compression test is executed. When the forced redundancy bit JR has high level H and the forced redundancy bit JC has low level L (upper right in FIG. 20), the redundancy word lines RWL and the real bit line pairs BL, /BL are selected. At this time, a redundancy memory cell RMC coupled to the redundancy word line RWL of the column block CBLK0 of each of the banks BK0-1 is accessed, and the forced redundancy compression test of the redundancy word lines RWL is executed.

When the forced redundancy bit JR has low level L and the forced redundancy bit JC has high level H (lower left in FIG. 20), the real word lines WL and the redundancy bit line pairs RBL, /RBL are selected. At this time, the redundancy memory cell RMC coupled to the redundancy bit line pair RBL (or /RBL) of the column block CBLK0 of each of the banks BK0-1 is accessed, and the forced redundancy compression test of the redundancy bit line pairs RBL, /RBL is executed. When the forced redundancy bits JR, JC both have high level H (lower right in FIG. 20), the redundancy word lines RWL and the redundancy bit line pairs RBL, /RBL are selected. At this time, the redundancy memory cell RMC disposed at an intersection of the redundancy word line RWL and the redundancy bit line pair (or /RBL) of the column block CBLK0 of each of the banks BK0-1 is accessed, and the forced redundancy compression test of the redundancy word lines RWL and the redundancy bit line pairs RBL, /RBL is executed.

Figure 21:
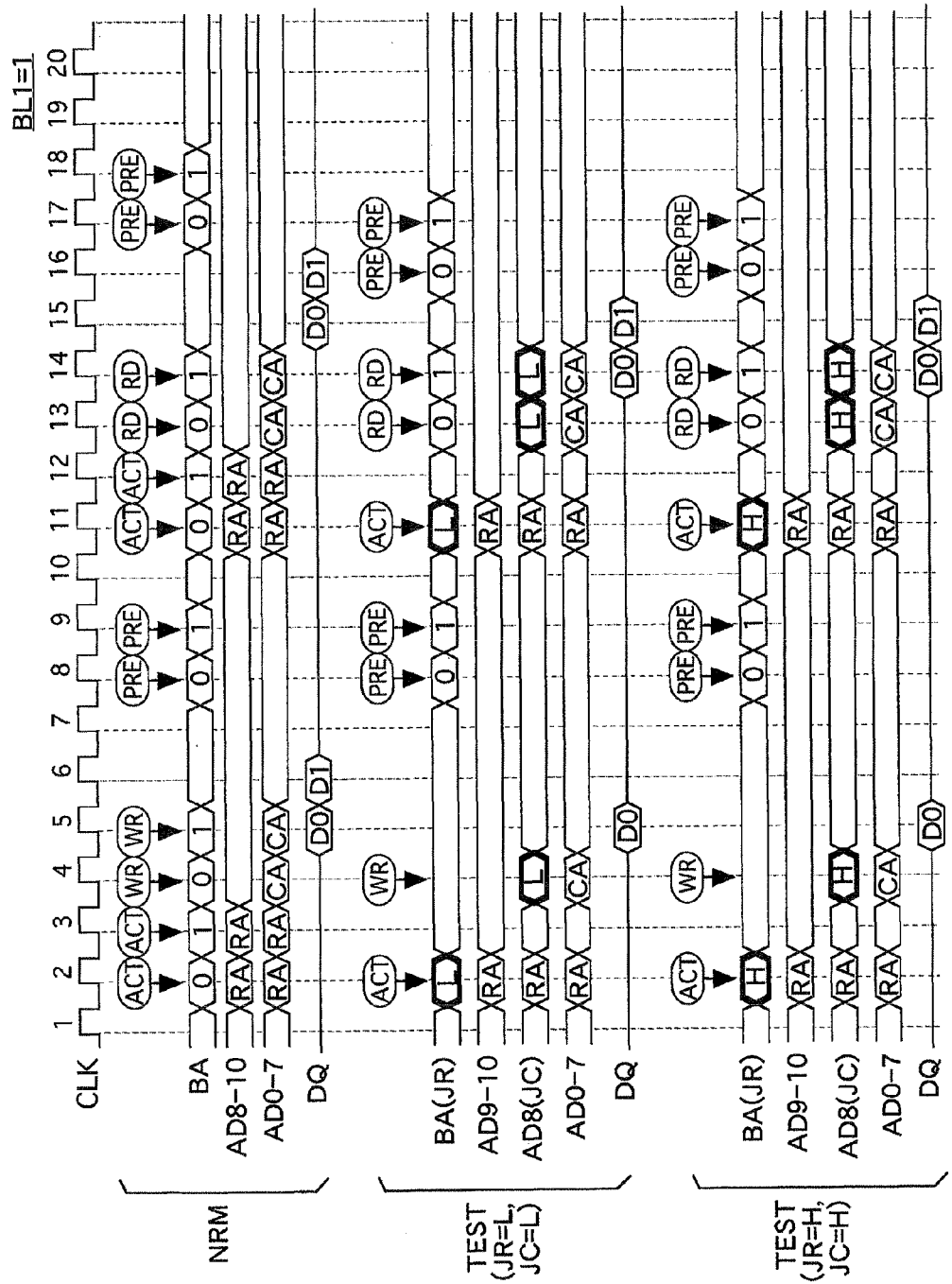
FIG. 21 illustrates operations of the memory illustrated in FIG. 19.

FIG. 21 illustrates operations of clock cycles CLK1-20 in the semiconductor memory MEM illustrated in FIG. 19. A detailed description of the same operations as those in FIG. 11 and FIG. 18 will be omitted. Operations in a normal operation mode NRM is the same as those in FIG. 6. FIG. 21 illustrates operations when the forced redundancy bits JR, JC both have low level L (TEST(JR=L, JC=L)) and operations when the forced redundancy bits JR, JC both have high level (TEST (JR=H, JC=H)) (corresponding to the upper left and the lower right in FIG. 20). As illustrated in the drawing, in this embodiment, the combination of the compression tests in FIG. 11 and FIG. 18 is executed. In this embodiment, the same effect as that of the above-described embodiments may also be obtained.

Figure 22:
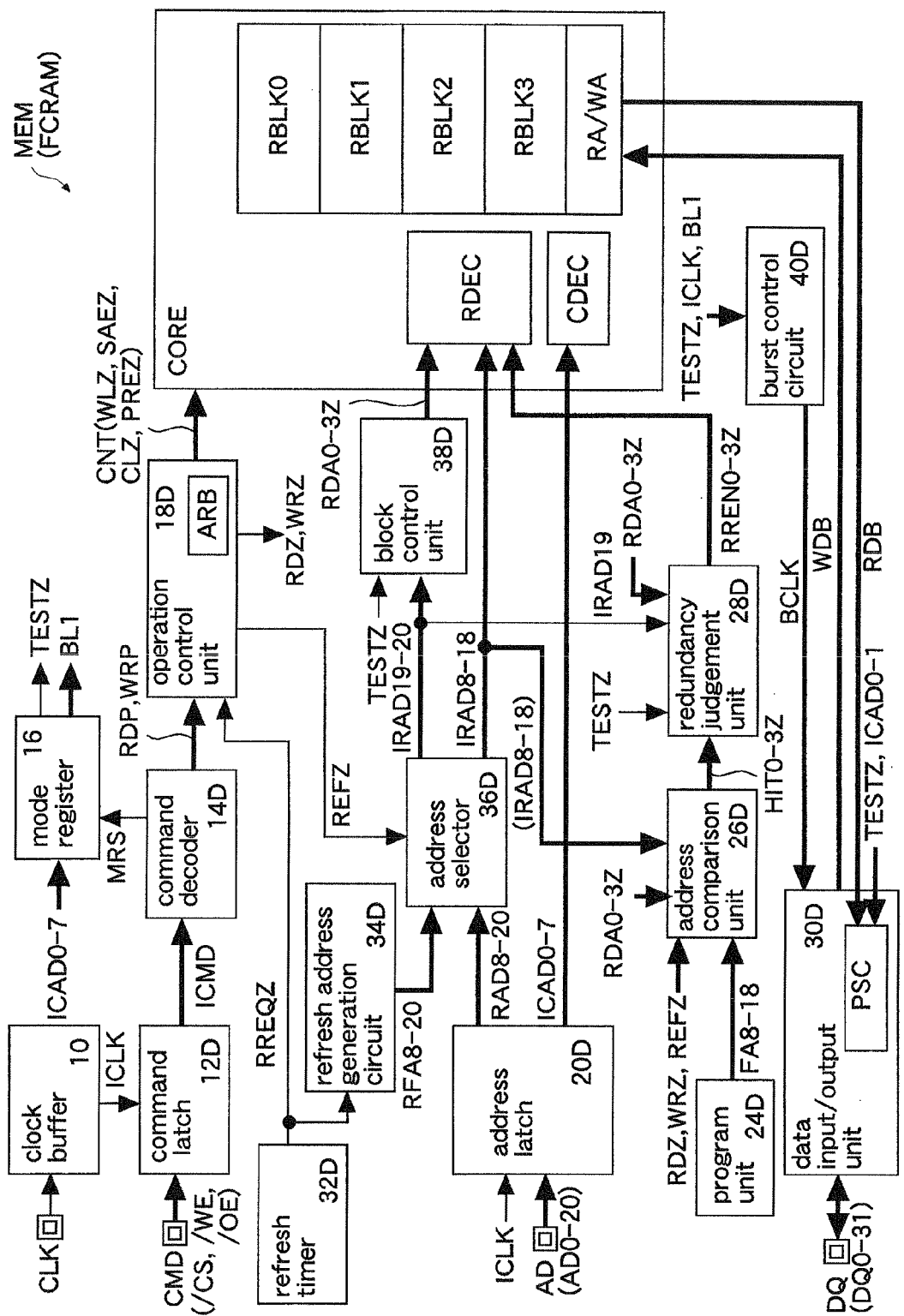
FIG. 22 illustrates another embodiment.

FIG. 22 illustrates another embodiment. A semiconductor memory MEM of this embodiment is a FCRAM (Fast Cycle RAM) of a pseudo SRAM type. The pseudo SRAM has memory cells (dynamic memory cells) of a DRAM and has an interface of a SRAM. This FCRAM may be designed as a semiconductor memory device sealed in a package or may be designed as a memory macro (IP) mounted in a system LSI or the like.

The semiconductor memory MEM has a command latch 12D, a command decoder 14D, an operation control unit 18D, an address latch 20D, a program unit 24D, an address comparison unit 26D, a redundancy judgment unit 28D, and a data input/output unit 30D instead of the command latch 12, the command decoder 14, the operation control unit 18, the address latch 20, the program unit 24, the address comparison unit 26, the redundancy judgment unit 28, and the data input/output unit 30 in FIG. 1. The semiconductor memory MEM further has a block control unit 38D instead of the bank control unit 22, and has a memory core CORE instead of the banks BK0-1. The memory core CORE has four row blocks RBLK0-3 similarly to the bank BK0 illustrated in FIG. 7. Further, the semiconductor memory MEM newly has a refresh timer 32D, a refresh address generation circuit 34D, an address selector 36D, and a burst control circuit 40D.

During a normal operation mode, the burst control circuit 40D outputs a burst clock signal BCLK having pulses as many as the number indicated by a burst length BL1 output from a mode register 16. The burst clock signal BCLK is generated in response to an internal clock signal ICLK. During a compression test mode (TESTZ=high level), the burst control circuit 40D forcibly outputs the burst clock signal BCLK having two pulses irrespective of the burst length BL1.

The data input/output unit 30D has a parallel/serial conversion circuit PSC. The parallel/serial conversion circuit PSC operates in response to the burst clock signal BCLK and converts parallel read data transferred to a read data bus RDB, into serial data. During the normal operation mode, the parallel/serial conversion circuit PSC decides the order in which the read data are output, according to a value of an internal address signal IAD0-1. During the compression test mode, the parallel/serial conversion circuit PSC converts parallel read data into serial data constantly in the same order irrespective of the value of the internal address signal IAD0-1, for instance.

The refresh timer 32D periodically generates a refresh request signal RREQZ. The refresh address generation circuit 34D sequentially generates a refresh address signal RFA8-20 in response to a refresh control signal REFPZ. The address selector 36D outputs the refresh address signal RFA8-20 as an internal row address signal IRAD8-20 when a refresh signal REFZ has high level, and outputs an external row address signal RAD8-20 as the internal row address signal IRAD8-20 when the refresh signal REFZ has low level.

The command latch 12D latches a command signal CMD in synchronization with a rising edge of the internal clock signal ICLK and outputs the latched signal as an internal command signal ICMD to the command decoder 14. The command signal CMD includes a chip select signal /CS, a write enable signal /WE, and an output enable signal /OE.

According to logic level of the internal command signal ICMD, the command decoder 14D outputs a read command signal RDP and a write command signal WRP commanding the execution of a read operation and a write operation of the memory CORE, or outputs a mode register set command signal MRS for setting the mode register 16.

The operation control unit 18D outputs to the memory core CORE a control signal CNT for the execution of an access operation (a read operation, a write operation, or a refresh operation) according to the read command signal RDP, the write command signal WRP, and the refresh request signal RREQZ (internal refresh command). Further, the operation control unit 18D has an arbiter ARB deciding a priority sequence when the external access command (the read command signal RDP or the write command signal WRP) and the internal refresh command REFPZ compete with each other. The operation control unit 18D activates a read signal RDZ when the read operation is to be executed, activates a write signal WRZ when the write operation is to be executed, and activates the refresh signal REFZ when the refresh operation is to be executed.

The address latch 20D latches address signals AD0-7 and AD8-20 in synchronization with a rising edge of the internal clock signal ICLK and outputs the latched signals as an internal row address signal RAD8-20 and an internal column address signal ICAD0-7. The semiconductor memory MEM of this embodiment adopts an address non-multiplex system. Therefore, the column address signal AD0-7 and the row address signal AD8-20 are supplied simultaneously via different parts of an address terminal AD.

During the normal operation mode, the block control unit 38D activates one of row decode signals RDA0-3Z according to logics of internal row address signals IRAD19-20. The row decode signals RDA0-3Z are supplied to a row decoder RDEC so that the row blocks RBLK0-3 are selected respectively. The internal row address signals RAD19-20 are row block address signals for the selection of the row blocks RBLK0-3. The internal row address signal IRAD19 is supplied for specifying the row blocks RBLK0, 2 or the row blocks RBLK 1, 3, and the internal row address signal IRAD20 is supplied for specifying the row blocks RBLK0-1 or RBLK2-3.

During the compression test mode, the block control unit 38D masks logic of the internal row address signal IRAD19 and activates the row decode signals RDA0-1Z or RDA2-3Z by using only the internal row address signal IRAD20. That is, during the compression test mode, a pair of the row blocks RBLK0-1 or a pair of the row blocks RBLK2-3 are simultaneously activated.

The program unit 24D stores four defect addresses for the row blocks RBLK0-3 respectively and outputs each of them as a fuse row address signal FA8-18. The two-bit address signals AD19-20 serve to specify the row blocks RBLK0-3, and therefore the two bits are not programmed in the program unit 24D. The address comparison unit 26D operates during the read operation, the write operation, and the refresh operation, and outputs four hit signals HIT0-3Z corresponding to the row blocks RBLK0-3 respectively.

The redundancy judgment unit 28D activates one of four redundancy enable signals RREN0-3Z according to the hit signals HITA0-3Z during the normal operation mode. The redundancy enable signals RREN0-3Z are supplied to the row blocks RBLK0-3 respectively. During the compression test mode, the redundancy judgment unit 28D forcibly activates a pair of the redundancy enable signals RREN0-1Z or a pair of the redundancy enable signals RREN2-3Z according to logics of the row decode signals RDA0-3Z irrespective of the hit signals HIT0-3Z when receiving the high-level row address signal IRAD19 in response to a read command or a write command. That is, during the compression test mode, a forced redundancy test is executed according to a value of the row address signal IRAD19 specifying the now blocks RBLK0, 2 or the row blocks RBLK1, 3.

Figure 23:
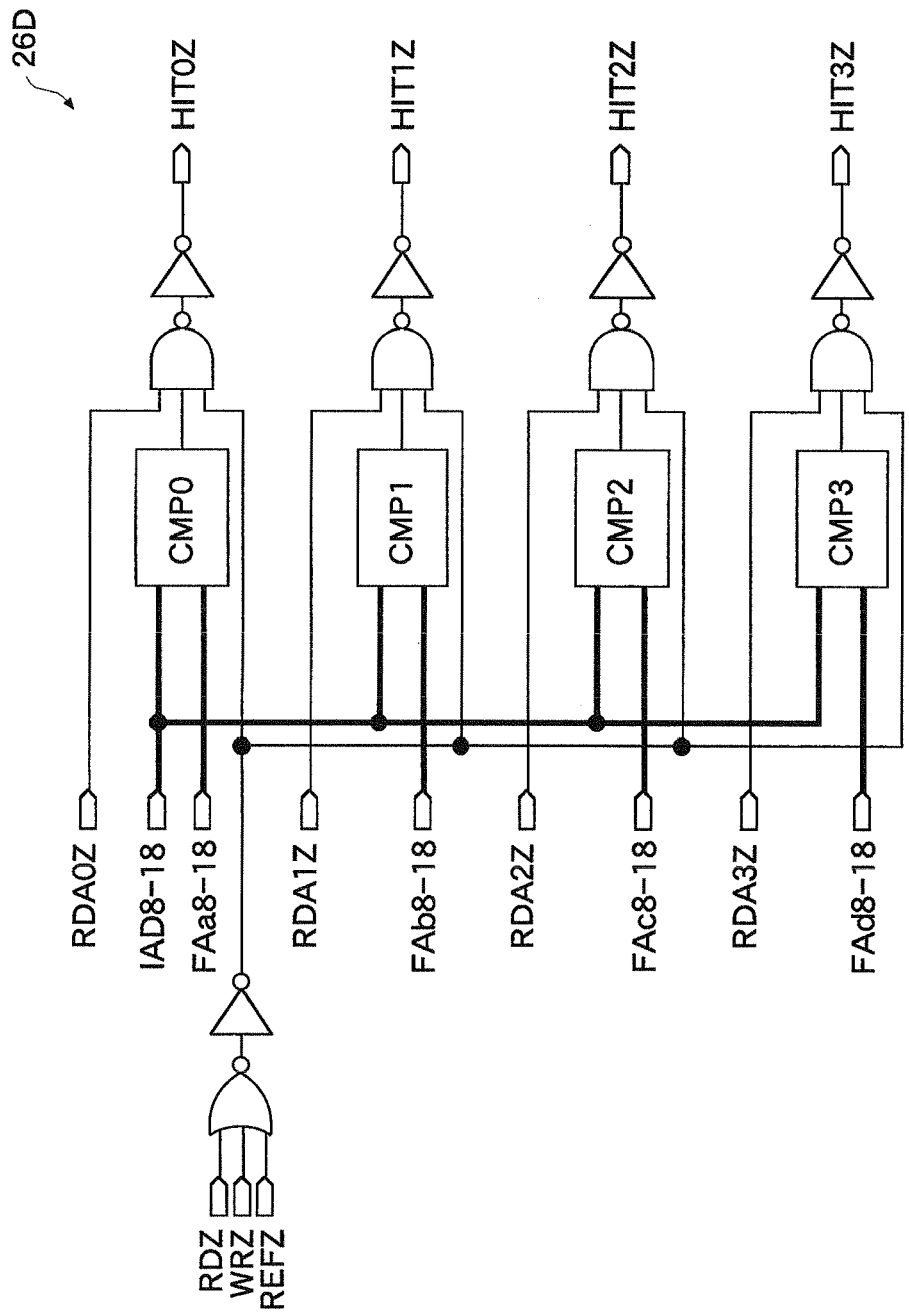
FIG. 23 illustrates details of an address comparison unit illustrated in FIG. 22.

FIG. 23 illustrates details of the address comparison unit 26D illustrated in FIG. 22. The basic configuration of the address comparison unit 26D is the same as that of the address comparison unit 26A illustrate in FIG. 8 except that its address comparison circuits CMP0-3 each compare an 11-bit row address, input signals of its 3-input NAND gates include the logics of the row decode signals RDA0-3Z, and the 3-input NAND gates become valid during the read operation (RDZ=high level), the write operation (WRZ=high level), and the refresh operation (REFZ=high level).

A fuse row address signal (redundancy address signal) FAa8-18 indicates a defect address of the row block RBLK0. Similarly, fuse row address signals FAb8-18, FAc8-18, FAd8-18 indicate defect addresses of the row blocks RBLK1-3 respectively. The hit signal HIT0Z is activated when a redundancy word line RWL of the row block RBLK0 is to be selected. Similarly, the hit signals HIT1Z-HIT3Z are activated when redundancy word lines RWL of the row blocks RBLK1-3 are to be selected.

Figure 24:
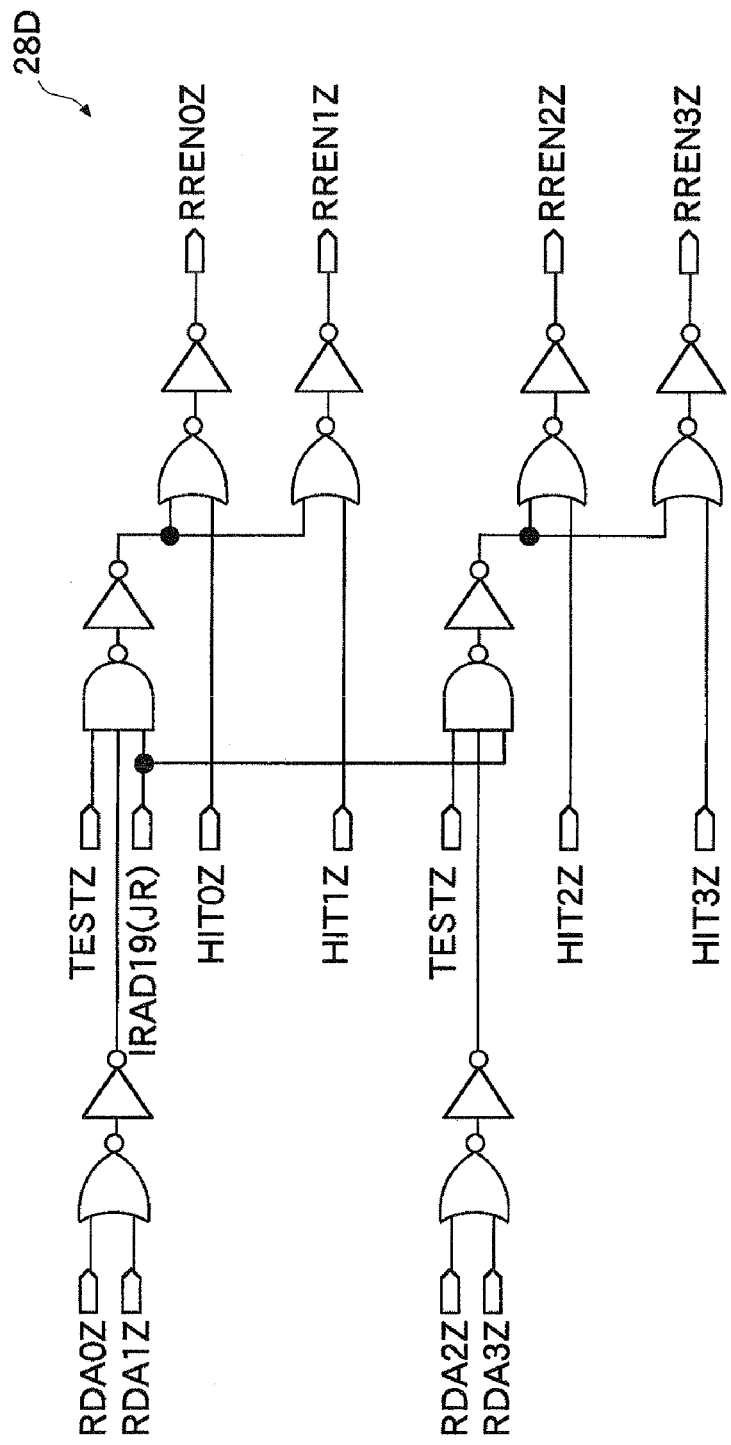
FIG. 24 illustrates details of a redundancy judgment unit illustrated in FIG. 22.

FIG. 24 illustrates details of the redundancy judgment unit 28D illustrated in FIG. 22. The redundancy judgment unit 28D activates one of the redundancy enable signals RREN0-3Z corresponding to the hit signals HIT0-3Z during the normal operation mode. During the compression test mode, the redundancy judgment unit 28D activates a pair of the redundancy enable signals RREN0-1Z or a pair of the redundancy enable signals RREN2-3Z simultaneously when the row address signal IRAD19 (JR) supplied along with the write command WR or the read command RD has high level.

Figure 25:
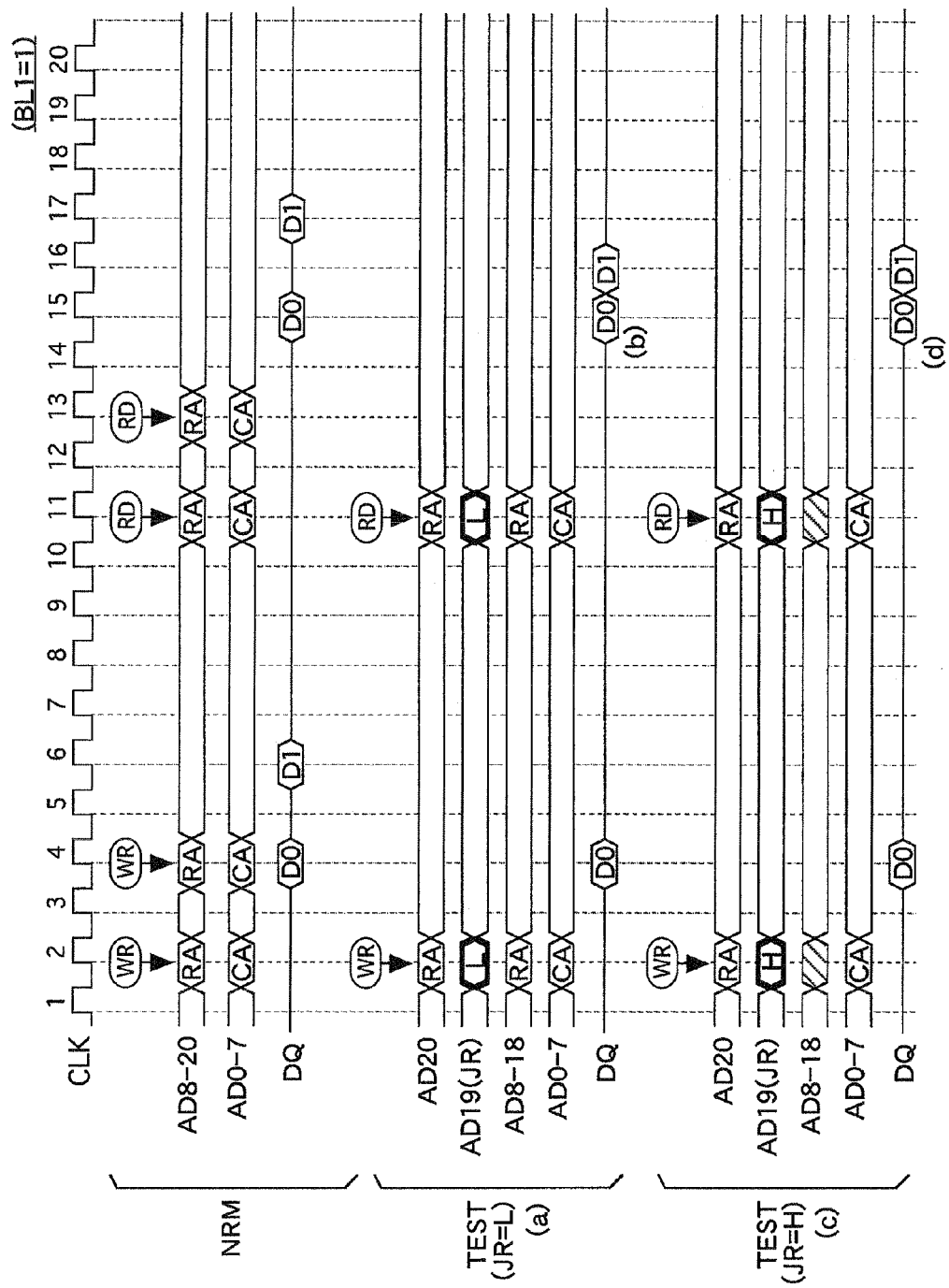
FIG. 25 illustrates operations of a memory illustrated in FIG. 22.

FIG. 25 illustrates operations of clock cycles CLK1-20 in the semiconductor memory MEM illustrated in FIG. 22. In the normal operation mode NRM (user mode) in which the CPU illustrated in FIG. 5 or the like accesses the semiconductor memory MEM, the now address signal RA and the column address signal CA are supplied along with the write command WR, and write data DQ is supplied as in a common pseudo SRAM. Further, the row address signal RA and the column address signal CA are supplied along with the read command RD and read data DQ is output. In this embodiment, a write latency is set to "2" and a read latency is set to "4". In response to the write command WR and the read command RD, a real word line WL is selected so that real memory cells MC are accessed, or a redundancy word line RWL is selected so that redundancy memory cells RMC are accessed.

In the compression test mode TEST testing the semiconductor memory MEM by the LSI tester TEST illustrated in FIG. 4 or the like, according to a value of the forced redundancy bit JR supplied to an address terminal AD19 along with the write command WR or the read command RD, a normal compression test or a forced redundancy compression test is executed. In the compression test of this embodiment, common write data is written simultaneously to the row blocks RBLK0-1 (or the row blocks RBLK2-3) according to the address signal AD20. Therefore, the row address signal AD19 for specifying the row blocks RBLK0, 2 (or the row blocks RBLK1, 3) is not necessary.

When the forced redundancy bit JR (forced redundancy signal) with low level L is supplied along with the write command WR or the read command RD (TEST(JR=L)), the normal compression test is executed ((a) of FIG. 25). In the normal compression test, only the real word lines WL are selected (the redundancy word lines RWL are not selected), and the real memory cells MC of the two row blocks RBLK (RBLK0-1 or RBLK2-3) are simultaneously accessed according to the address signal AD20. In a read operation of the compression test, parallel data signals D0, D1 simultaneously read from the two row blocks RBLK to be transmitted to the read data bus RDB are converted into serial data signals D0, D1 by the parallel/serial conversion circuit PSC and are output sequentially from a data terminal DQ ((b) of FIG. 25). Therefore, in this embodiment, during the compression test mode, the burst control circuit 40D outputs the burst clock signal BCLK having pulses twice as many as the number indicated by the set burst length BL1. Consequently, the conflict of the read data signals D0, D1 at the data terminal DQ may be reduced.

On the other hand, when the forced redundancy bit JR with high level H is supplied to the external address terminal AD19 (block address terminal) along with the write command WR or the read command RD (TEST(JR=H)), the forced redundancy compression test is executed ((c) of FIG. 25). In the forced redundancy compression test, the redundancy word lines RWL of a pair of the row blocks RBLK selected according to the row address signal AD20 are forcibly selected irrespective of the value of the row address signal AD8-18 and the redundancy memory cells RMC are accessed, as previously described. The oblique lines illustrated in the waveform of the address signal AD8-18 indicate that the row address signal is masked. In the forced redundancy compression test as well, the parallel data signals D0, D1 read simultaneously from a pair of the row blocks RBLK to be transmitted to the read data bus RDB are converted into the serial data signals D0, D1 by the parallel/serial conversion circuit PSC and are sequentially output from the data terminal DQ ((d) of FIG. 25).

In the compression test, by judging whether to execute the forced redundancy test by using the row address signal AD19 not used, the redundancy word lines RWL may forcibly select without using a dedicated terminal. Since, during the compression test mode, it is judged whether to execute the forced redundancy test or not only when the write command WR is supplied and when the read command RD is supplied, the forced redundancy test is not executed by mistake during the normal operation mode. That is, a malfunction of the semiconductor memory MEM may be reduced.

As described above, in this embodiment, the same effect as that of the above-described embodiments may be obtained. In addition, in this embodiment, in a FCRAM of a pseudo SRAM type as well, the redundancy memory cells RMC coupled to the redundancy word lines RWL of the plural row blocks RBLK may simultaneously test without providing any special terminal. As a result, the test time of the redundancy memory cells RMC before a defect is relieved may be shortened.

Figure 26:
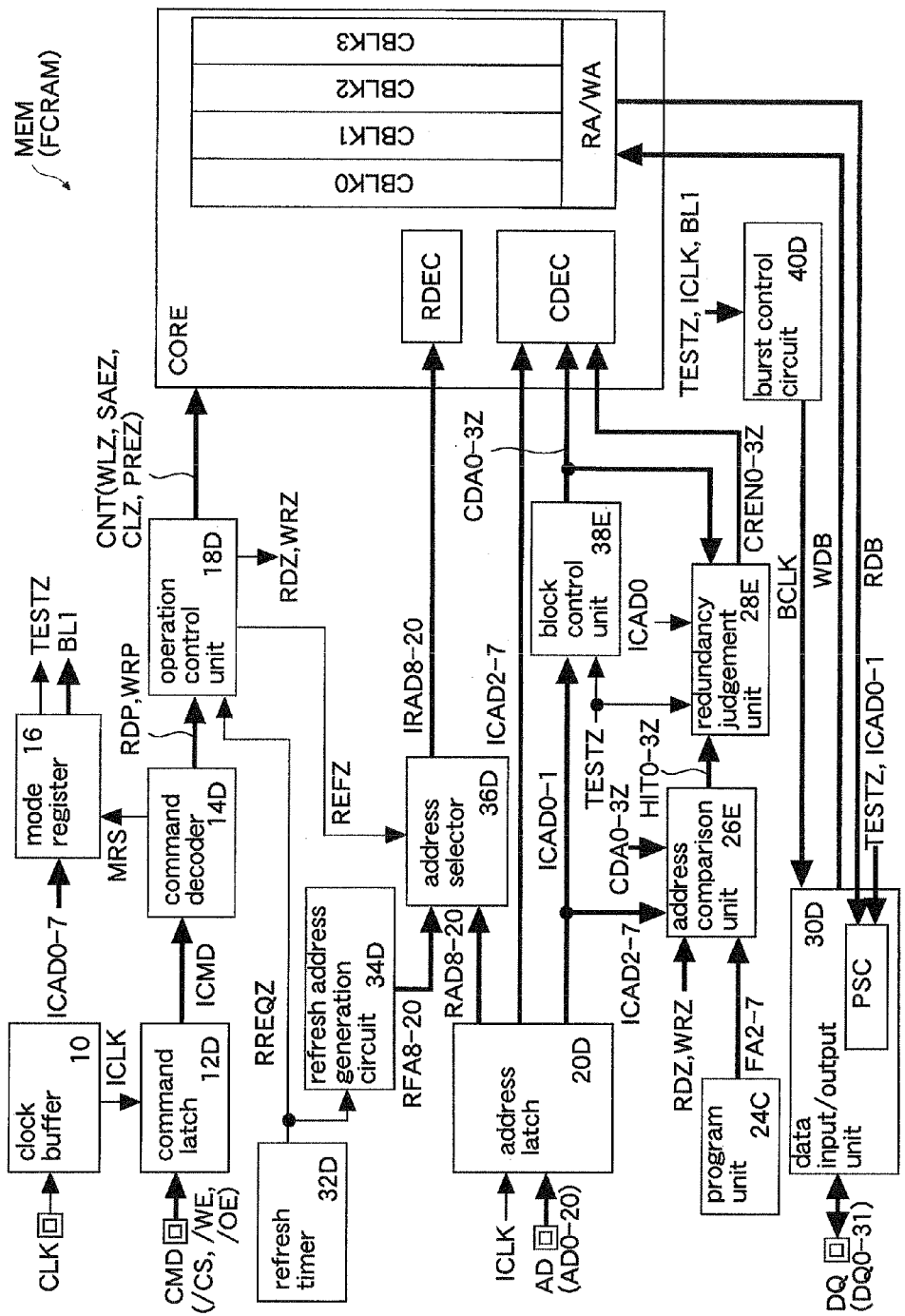
FIG. 26 illustrates another embodiment.

FIG. 26 illustrates another embodiment. The same elements as the elements described in the above-described embodiments will be denoted by the same reference numerals and symbols and a detailed description thereof will be omitted. In this embodiment, a memory core has four column blocks CBLK0-3. The column blocks CBLK0-3 each have a redundancy bit line pair RBL, /RBL similarly to the row blocks RBLK in FIG. 12. Since the plural redundancy bit line pairs RBL, /RBL are provided in the column blocks CBLK0-3 respectively, a semiconductor memory MEM has a program unit 24C, an address comparison unit 26E, a redundancy judgment unit 28E, and a block control unit 38E instead of the program unit 24D, the address comparison unit 26D, the redundancy judgment unit 28D, and the block control unit 38D in FIG. 22. The program unit 24C is the same as that in FIG. 15. The other configuration is the same as that in FIG. 22 except that its row decoder RDEC and column decoder CDEC are partly different. That is, the semiconductor memory MEM is a FCRAM of a pseudo SRAM type.

The address comparison unit 26E outputs four hit signals HIT0Z-3Z corresponding to the column blocks CBLK0-3 respectively. The redundancy judgment unit 28E outputs four redundancy enable signals CREN0Z-3Z corresponding to the column blocks CBLK0-3 respectively.

During a normal operation mode, the block control unit 38E activates one of column decode signals CDA0-3Z according to logics of internal column address signals ICAD0-1. The column decode signals CDA0-3Z are supplied to the column decoder CDEC for the selection of the column blocks CBLK0-3 respectively. The internal column address signals CAD0-1 are column block address signals for the selection of the column blocks CBLK0-3. The internal column address signal ICAD0 is supplied for specifying the column blocks CBLK0, 2 or the column blocks CBLK1, 3, and the internal column address signal ICAD1 is supplied for specifying the column blocks CBLK0-1 or CBLK2-3.

During a compression test mode, the block control unit 38E masks the logic of the internal column address signal ICAD0 and activates the column decode signals CDA0-1Z or CDA2-3Z by using only the internal column address signal ICAD1. That is, during the compression test mode, a pair of the column blocks CBLK0-1 or a pair of the column blocks CBLK2-3 are simultaneously activated.

Figure 27:
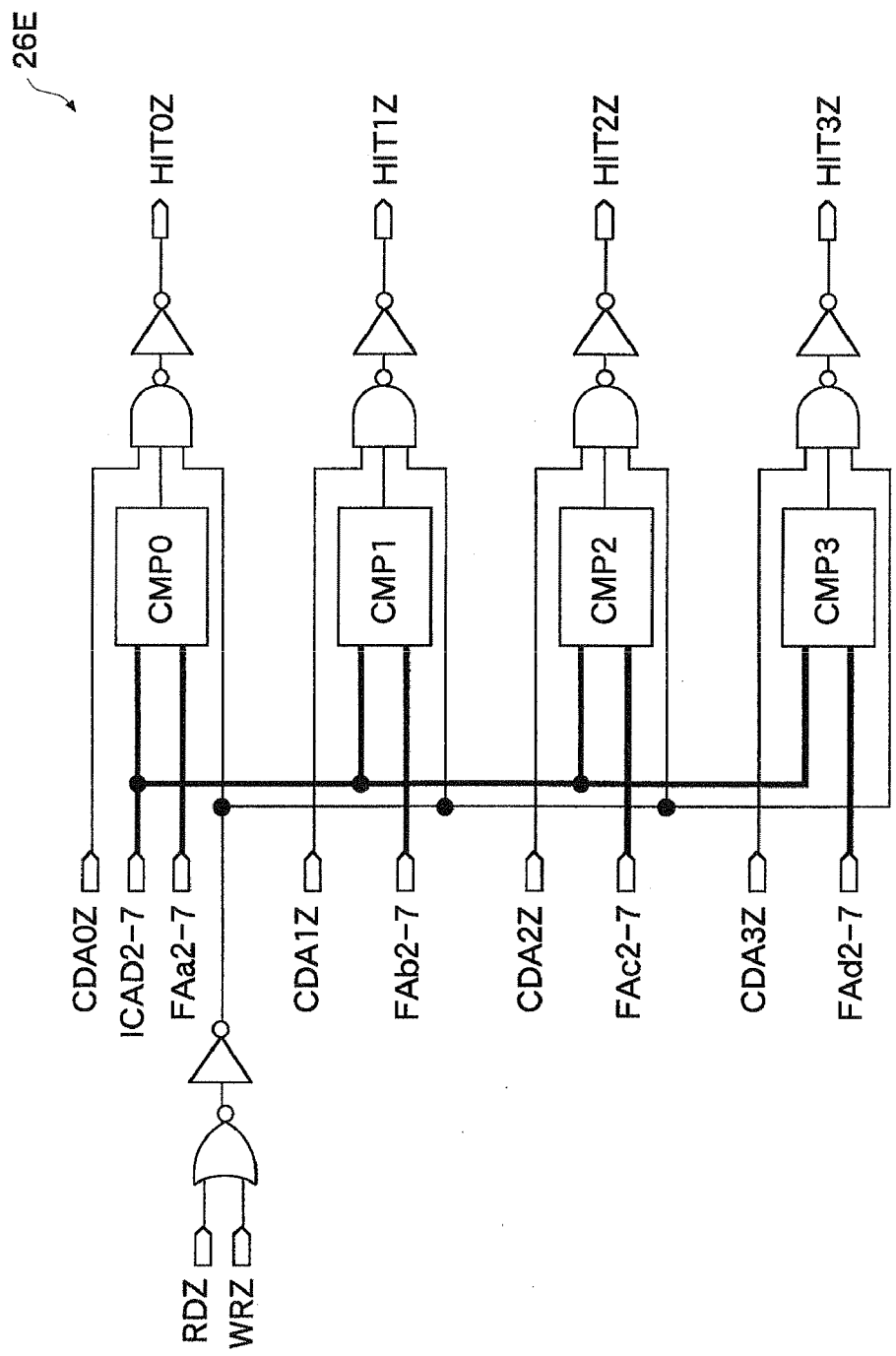
FIG. 27 illustrates details of an address comparison unit illustrated in FIG. 26.

FIG. 27 illustrates details of the address comparison unit 26E illustrated in FIG. 26. The address comparison unit 26E is the same as the address comparison unit 26D illustrate in FIG. 23 except that the number of bits of an address signal ICAD2-7 that it compares is different, input signals of its 3-input NAND gates include logics of the column decode signals CDA0-3Z, and it does not receive a refresh signal REFZ. A fuse column address signal (redundancy address signal) FAa2-7 indicates a defect address of the column block CBLK0. Similarly, fuse column address signals FAb2-7, FAc2-7, FAd2-7 indicate defect addresses of the column blocks CBLK1-3 respectively.

Figure 28:
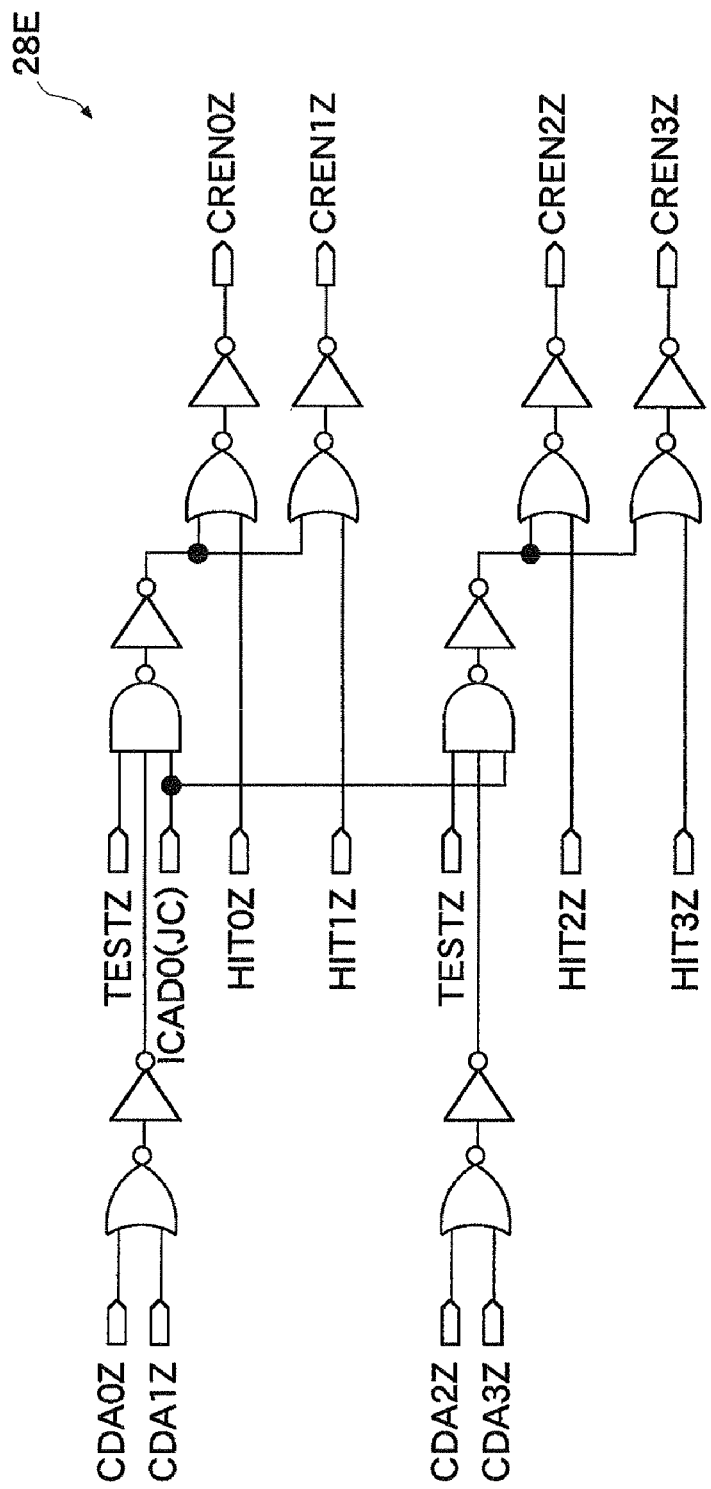
FIG. 28 illustrates details of a redundancy judgment unit illustrated in FIG. 26.

FIG. 28 illustrates details of the redundancy judgment unit 28E illustrated in FIG. 26. The redundancy judgment unit 28E is the same as the redundancy judgment unit 28D illustrated in FIG. 24 except that input signals of its 3-input NAND gates include the logics of the column decode signals CDA0-3Z and the logic of the column address signal ICAD0 (forced redundancy bit JC).

Figure 29:
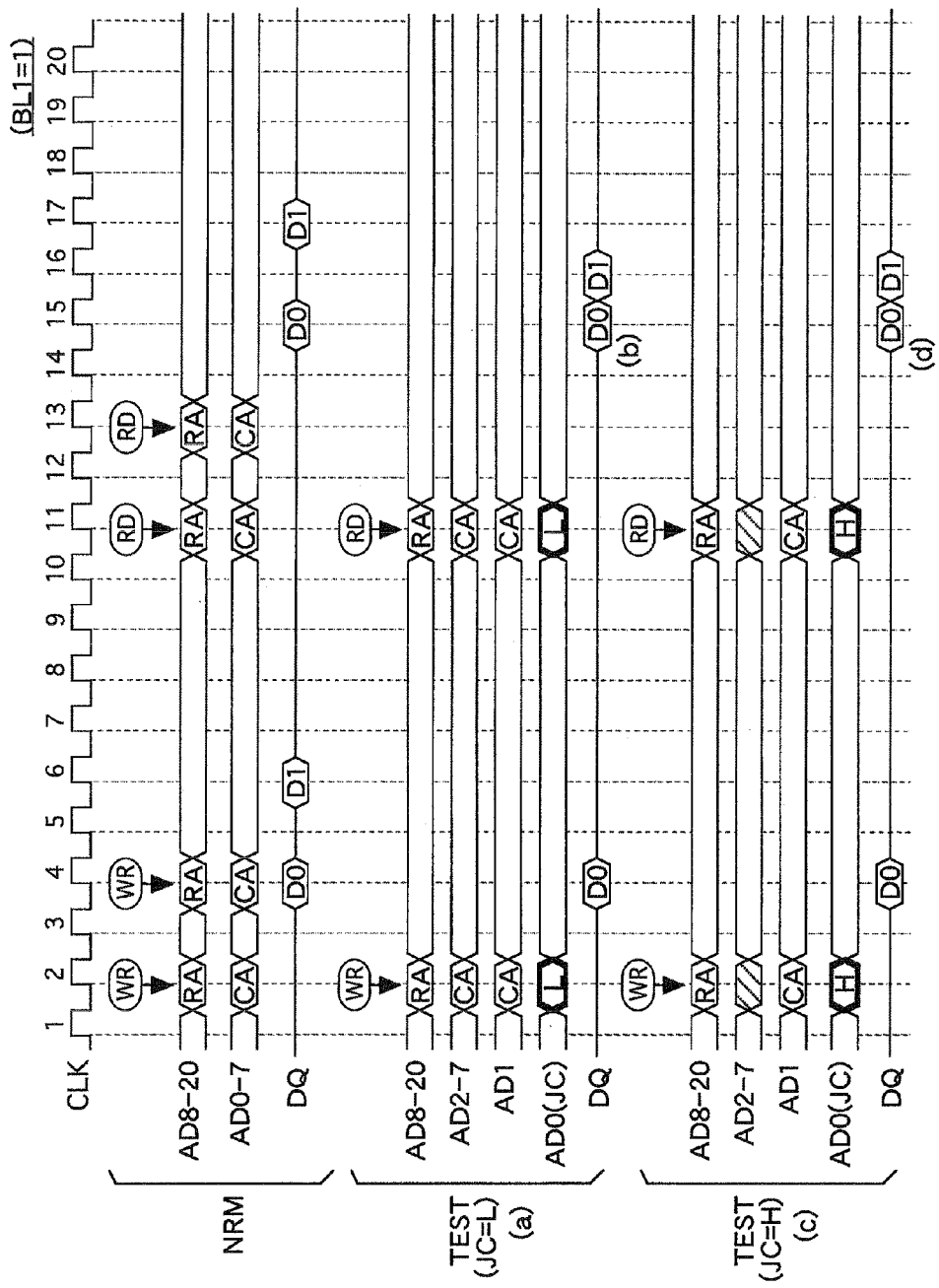
FIG. 29 illustrates operations of a memory illustrated in FIG. 26.

FIG. 29 illustrates operations of clock cycles CLK1-20 in the semiconductor memory MEM illustrated in FIG. 26. A detailed description of the same operations as those in FIG. 25 will be omitted. Operations in a normal operation mode NRM are the same as those in FIG. 25. In a compression test mode TEST, according to a value of the forced redundancy bit JC supplied to an address terminal AD0 along with a write command WR or a read command RD, a normal compression test or a forced redundancy compression test is executed.

In the compression test of this embodiment, common write data is written simultaneously to the column blocks CBLK0-1 (or the column blocks CBLK2-3) according to the column address signal AD1. Therefore, the column address signal AD0 for specifying the column blocks CBLK0, 2 (or the column blocks CBLK1, 3) is not necessary. The column address terminal AD0 functions as a block address terminal receiving the block address signal AD0 for specifying the column blocks CLK0-3.

When the forced redundancy bit JC with low level L is supplied along with the write command WR or the read command RD (TEST(JC=L)), the normal compression test is executed ((a) of FIG. 29). In the normal compression test, only real bit line pairs BL, /BL are selected (the redundancy bit line pairs RBL, /RBL are not selected), and real memory cells MC of the two column blocks CBLK (CBLK0-1 or CBLK2-3) are simultaneously accessed according to the column address signal AD1. In a read operation of the compression test, parallel data signals D0, D1 simultaneously read from the two column blocks CBLK to be transmitted to a read data bus RDB are converted into serial data signals D0, D1 by a parallel/serial conversion circuit PSC and are output sequentially from a data terminal DQ ((b) of FIG. 29). Consequently, the conflict of the read data signals D0, D1 at the data terminal DQ may be reduced.

On the other hand, when the forced redundancy bit JC with high level H is supplied to the external address terminal AD0 (block address terminal) along with the write command WR or the read command RD (TEST(JC=H)), the forced redundancy compression test is executed ((c) of FIG. 29). In the forced redundancy compression test, the redundancy bit line pairs RBL, /RBL of a pair of the column blocks CBLK are forcibly selected according to the value of the column address signal AD1 irrespective of a value of the column address signals AD2-7 and redundancy memory cells RMC are accessed. The oblique lines illustrated in the waveform of the address signal AD2-7 indicate that the column address signal CA is masked. In the forced redundancy compression test as well, the parallel data signals D0, D1 read simultaneously from a pair of the column blocks CBLK to be transmitted to the read data bus RDB are converted into the serial data signals D0, D1 by the parallel/serial conversion circuit PSC and are sequentially output from the data terminal DQ ((d) of FIG. 29).

In the compression test, by judging whether to execute the forced redundancy test by using the column address signal AD0 not used, the redundancy bit line pairs RBL, /RBL may forcibly select without using a dedicated terminal. Since, during the compression test mode, it is judged whether to execute the forced redundancy test or not only at the time of the supply of the write command WR and at the time of the supply of the read command RD, the forced redundancy test is not executed by mistake during the normal operation mode. That is, a malfunction of the semiconductor memory MEM may be reduced.

As described above, in this embodiment, the same effect as that of the above-described embodiments may also be obtained. In addition, in this embodiment, in a FCRAM of a pseudo SRAM type as well, the redundancy memory cells RMC coupled to the redundancy bit line pairs RBL, /RBL of the plural column blocks CBLK may simultaneously test without providing any special terminal. As a result, the test time of the redundancy memory cells RMC before a defect is relieved may be shortened.

Figure 30:
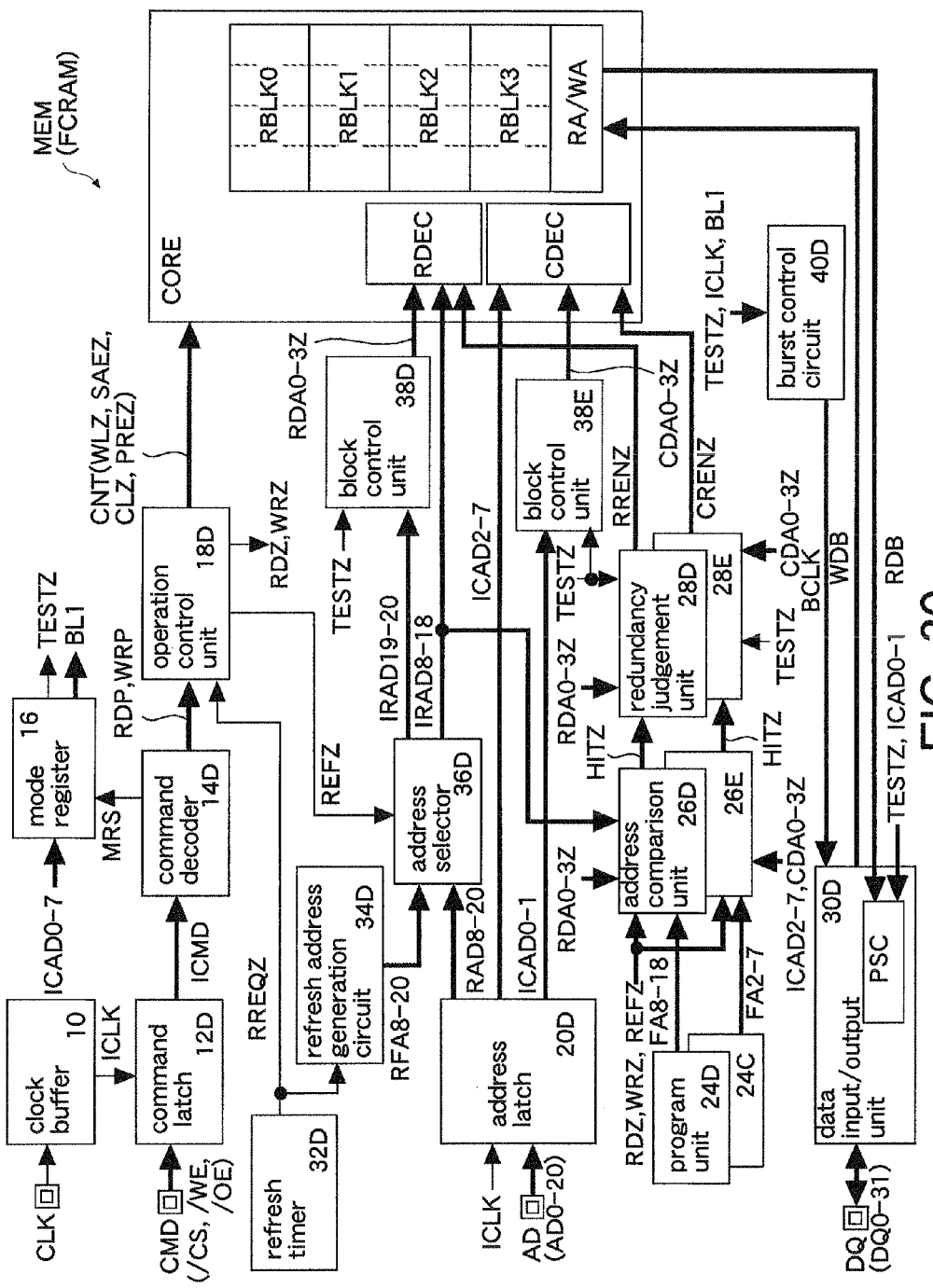
FIG. 30 illustrates another embodiment.

FIG. 30 illustrates another embodiment. The same elements as the elements described in the above-described embodiments will be denoted by the same reference numerals and symbols and a detailed description thereof will be omitted. In this embodiment, a memory core CORE has four row blocks RBLK0-3. The row blocks RBLK0-3 each are divided into four column blocks CBLK0-3 as illustrated by the broken lines in the drawing. That is, the row blocks RBLK0-3, similarly to those in FIG. 19, each have a redundancy word line RWL and a redundancy bit line pair RBL, /RBL.

A semiconductor memory MEM has the program unit 24D, the address comparison unit 26D, and the redundancy judgment unit 28D which are illustrated in FIG. 22 in order to select the redundancy word line RWL of each of the row blocks RBLK0-3. Further, the semiconductor memory MEM has the program unit 24C, the address comparison unit 26E, the redundancy judgment unit 28E, and the block control unit 38E which are illustrated in FIG. 26 in order to select the redundancy bit line pair RBL, /RBL of each of the column blocks CBLK0-3. The other configuration is the same as that in FIG. 22 except that its row decoder RDEC and column decoder CDEC are partly different. That is, the semiconductor memory MEM is a FCRAM of a pseudo SRAM type. In this embodiment, as in the semiconductor memory MEM illustrated in FIG. 19, a normal compression test or a forced redundancy compression test is executed during a compression test mode TEST according to values of forced redundancy bits JR, JC supplied along with a write command WR or a read command RD.

Figure 31:
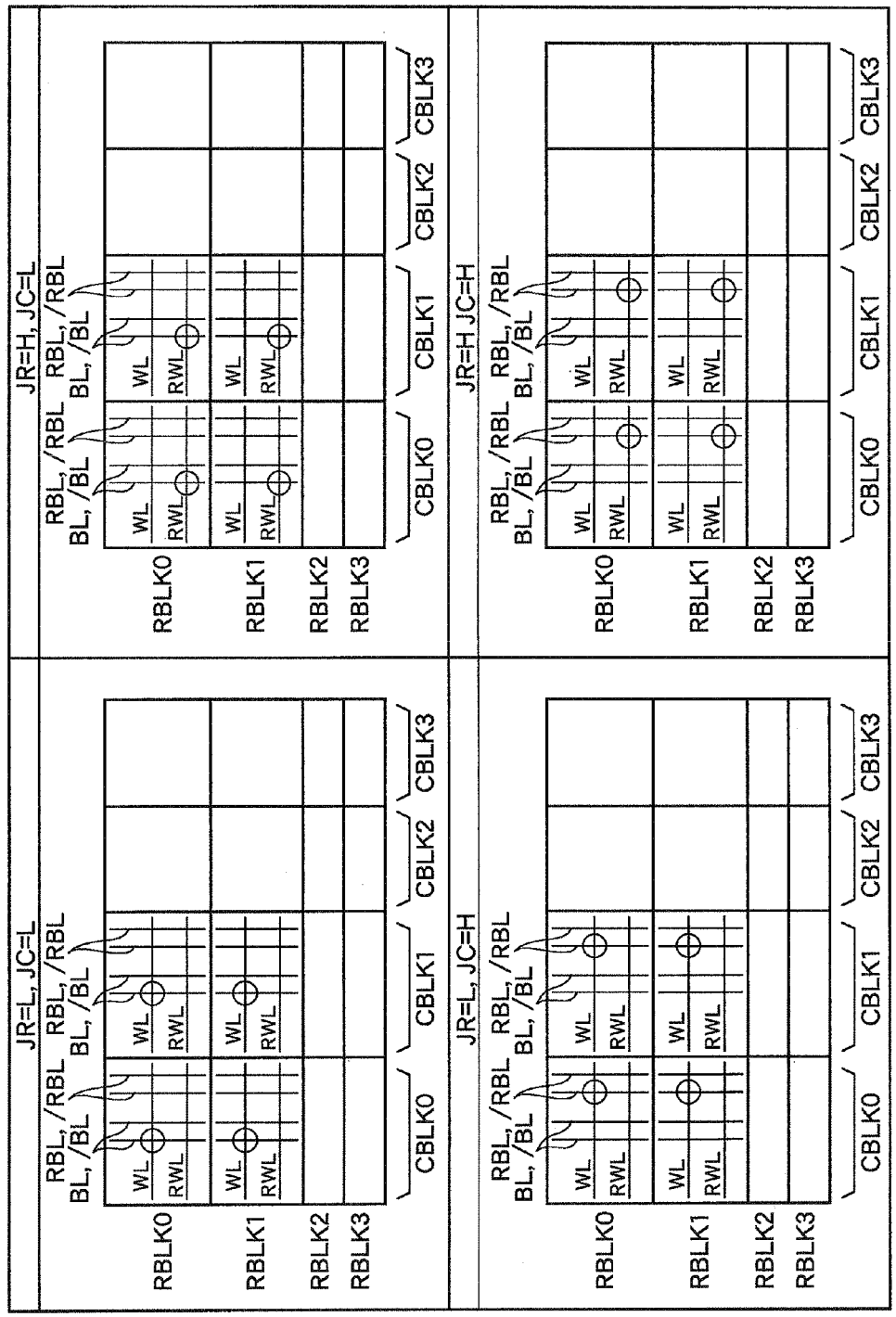
FIG. 31 illustrates an outline of a compression test of a memory illustrated in FIG. 30.

FIG. 31 illustrates an outline of the compression test of the semiconductor memory MEM illustrated in FIG. 30. FIG. 31 illustrates an example where the column blocks CBLK0-1 in the row blocks RBLK0-1 are accessed. In this embodiment, the normal compression test or the forced redundancy compression test is executed during the compression test mode according to the value of the forced redundancy bit JR supplied to an address terminal AD19 along with the write command WR or the read command RD and the value of the forced redundancy bit JC supplied to an address terminal AD0 along with the write command WR or the read command RD. The circles in the drawing represent real memory cells MC or redundancy memory cells RMC that are to be accessed.

Concretely, when the forced redundancy bits JR, JC both have low level L (upper left in FIG. 31), real word lines WL and real bit line pairs BL, /BL in the column blocks CBLK0-1 of each of the row blocks RBLK0-1 are selected. At this time, the two real memory cells MC in the column blocks CBLK0-1 of each of the row blocks RBLK0-1 are accessed, and the normal compression test is executed. When the forced redundancy bit JR has high level H and the forced redundancy bit JC has low level L (upper right in FIG. 31), the redundancy word lines RWL and the real bit line pairs BL, /BL are selected. At this time, the redundancy memory cells RMC coupled to the redundancy word lines RWL of the column blocks CBLK0-1 of each of the row blocks RBLK0-1 are accessed, and the forced redundancy compression test of the redundancy word lines RWL is executed.

When the forced redundancy bit JR has low level L and the forced redundancy bit JC has high level H (lower left in FIG. 31), the real word lines WL and the redundancy bit line pairs RBL, /RBL are selected. At this time, the redundancy memory cells RMC coupled to the redundancy bit line pairs RBL (or /RBL) in the column blocks CBLK0-1 of each of the row blocks RBLK0-1 are accessed, and the forced redundancy compression test of the redundancy bit line pairs RBL, /RBL is executed. When the forced redundancy bits JR, JC both have high level H (lower right in FIG. 31), the redundancy word lines RWL and the redundancy bit line pairs RBL, /RBL are selected. At this time, the redundancy memory cells RMC disposed at intersections of the redundancy word lines RWL and the redundancy bit line pairs (or /RBL) in the column blocks CBLK0-1 of each of the row blocks RBLK0-1 are accessed, and the forced redundancy compression test of the redundancy word lines RWL and the redundancy bit line pairs RBL, /RBL is executed.

Figure 32:
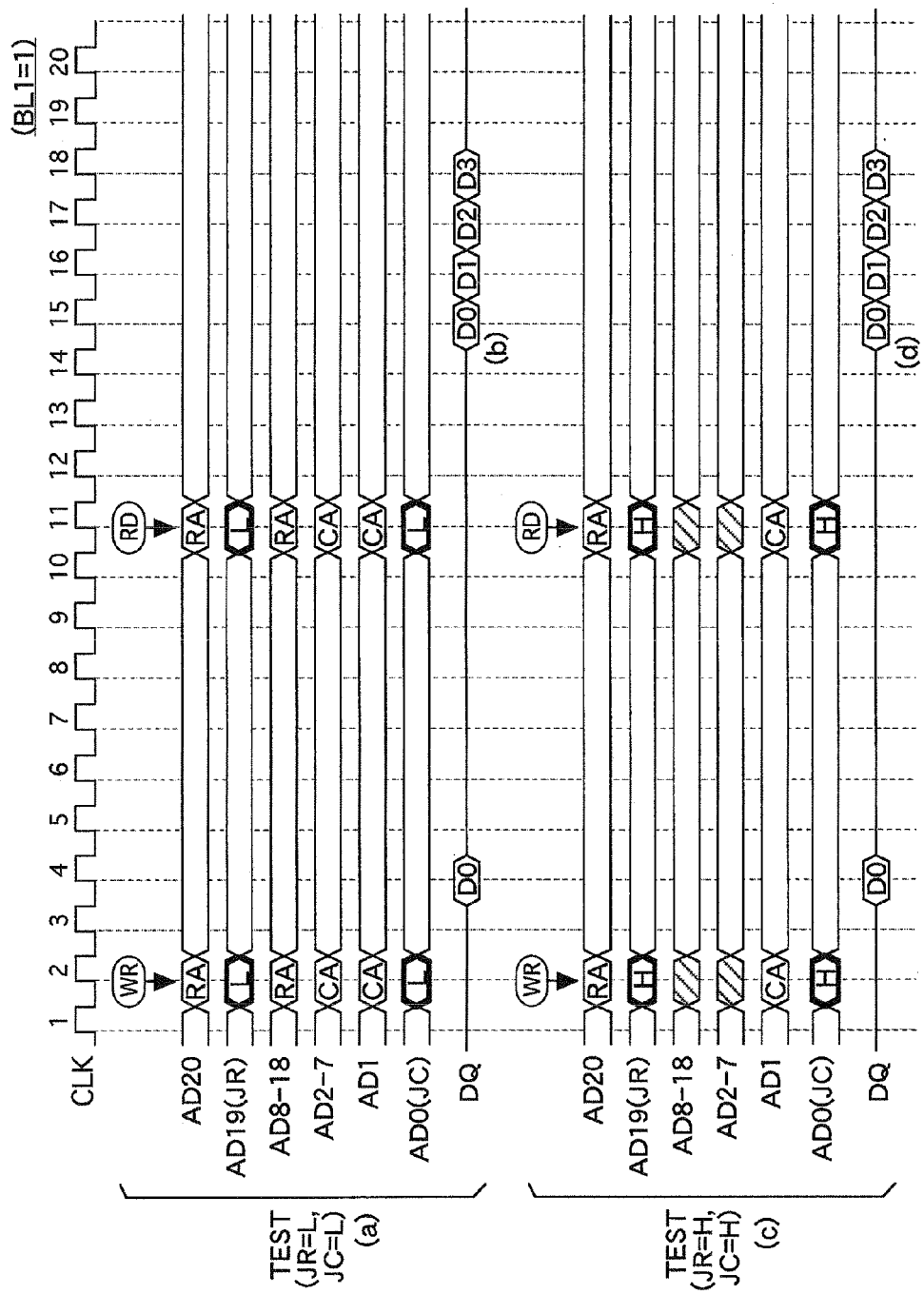
FIG. 32 illustrates operations of the memory illustrated in FIG. 30.

FIG. 32 illustrates operations of the semiconductor memory MEM illustrated in FIG. 30. The same operations as those in FIG. 25 and FIG. 29 will be denoted by the same reference numerals and symbols and a detailed description thereof will be omitted. Operations in a normal operation mode NRM are the same as those in FIG. 25 and therefore a description thereof will be omitted. FIG. 32 illustrates operations when the forced redundancy bits JR, JC both have low level L or operations when the forced redundancy bits JR, JC both have high level (corresponding to the upper left and the lower right in FIG. 31).

As illustrated in the drawing, in this embodiment, the combination of the compression tests in FIG. 25 and FIG. 29 is executed. However, as illustrated in FIG. 32, in the compression test, common data is written to the two memory cells MC (or RMC) of each of a pair of the row blocks RBLK (RBLK0-1 or RBLK2-3). Therefore, the semiconductor memory MEM needs to output four read data signals D0-D3 in response to a read command RD. Therefore, in this embodiment, a parallel/serial conversion circuit PSC has a function of outputting the four read data signals D0-D3 (twice as many as the number indicated by a burst length BL1) in response to each read command RD during the compression test mode. As described above, in this embodiment, the same effect as that of the above-described embodiments may be obtained.

In the above-described embodiments illustrated in FIG. 1 to FIG. 21, the examples where the burst length BL1 is set to "1" is described. However, the burst length BL1 may be "2" or "4", for instance. When the burst length BL1 is set to "2", in the compression test illustrated in FIG. 6, a common data signal is written to the two memory cells MC or RMC of each of the banks BK0-1 in response to the write command WR. Then, in response to the read command RD, the common data signal is read sequentially from the four memory cells MC or RMC of the banks BK0-1. When the burst length BL1 is set to "2", in the compression test illustrated in FIG. 21, a common data signal is written to the four memory cells MC or RMC of each of the banks BK0-1 in response to the write command WR. Then, in response to the read command RD, the common data signal is read sequentially from the eight memory cells MC or RMC of the banks BK0-1. In the embodiments illustrated in FIG. 22 to FIG. 32 as well, in the compression test, data signals twice as many as the number indicated by the burst length BL1 are sequentially output from the data terminal DQ in response to the read command RD.

In the above-described embodiments, the examples where the embodiments are applied to the semiconductor memory MEM operating in response to the clock signal CLK are described. However, they may be applied to a semiconductor memory MEM operating asynchronously with the clock signal CLK, for instance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor memory comprising:
a plurality of memory blocks being accessed independently during a normal operation mode, being accessed simultaneously during a test mode in order for common data to be written to the plurality of memory blocks, and including real memory cells and redundancy memory cells;
a block control unit selecting one of the memory blocks according to a block address signal specifying one of the memory blocks during the normal operation mode, and selecting the plurality of memory blocks irrespective of the block address signal during the test mode; and
a redundancy access unit accessing the redundancy memory cells of one of the memory blocks corresponding to the block address signal when an external address signal matches a defect address during the normal operation mode, and simultaneously accessing the redundancy memory cells of the plurality of memory blocks when a forced redundancy signal indicates a first level during the test mode, the forced redundancy signal being supplied to one of a block address terminal receiving the block address signal and a part of external address terminals receiving the external address signal.

2. The semiconductor memory according to claim 1, further comprising
an address input circuit receiving a row address signal which selects a word line of each of the memory blocks and a column address signal which selects a bit line in each of the memory blocks at the external address terminals being common at different timings, and receiving the block address signal and the forced redundancy signal at the block address terminal different from the external address terminals.

3. The semiconductor memory according to claim 2, further comprising
a command input circuit receiving an active command which activates the word line and receiving a write command and a read command which access to either the real memory cells or the redundancy memory cells coupled to the word line being activated, wherein:
during the test mode, the address input circuit receives the forced redundancy signal at the block address terminal in response to the active command, and receives the block address signal at the block address terminal in response to the read command; and
the redundancy access unit judges a level of the forced redundancy signal in response to the active command.

4. The semiconductor memory according to claim 1, further comprising
an address input circuit receiving a part of a row address signal which selects a word line of each of the memory blocks at a part of the external address terminals, receiving a column address signal which selects a bit line in each of the memory blocks and a rest of the row address signal at a rest of the external address terminals at different timings, receiving the block address signal at the block address terminal different from the external address terminals, and receiving the forced redundancy signal at the part of the external address terminals in response to the column address signal.

5. The semiconductor memory according to claim 4, further comprising
a command input circuit receiving an active command which activates the word line and receiving a write command and a read command which access to either the real memory cells or the redundancy memory cells coupled to the word line being activated, wherein:

during the test mode, the address input circuit receives the forced redundancy signal at the part of the external address terminals in response to the write command and the read command, and receives the block address signal at the block address terminal in response to the read command; and the redundancy access unit judges a level of the forced redundancy signal in response to the write command and the read command.

6. The semiconductor memory according to claim 1, further comprising an address input circuit receiving a row address signal which selects a real word line of each of the memory blocks and a column address signal which selects a real bit line in each of the memory blocks at different parts of the external address terminals at a same timing, wherein:

the memory blocks each include the real word line coupled to the real memory cells and a redundancy word line coupled to the redundancy memory cells; and the address input circuit receives a part of the row address signal as the block address signal at the block address terminal.

7. The semiconductor memory according to claim 6, further comprising a command input circuit receiving a write command and a read command which select one of the real word line and the redundancy word line in order to access to either the real memory cells or the redundancy memory cells, wherein:

during the test mode, the address input circuit receives the forced redundancy signal at the block address terminal in response to the write command and the read command; and the redundancy access unit judges a level of the forced redundancy signal in response to the write command and the read command.

8. The semiconductor memory according to claim 1, further comprising an address input circuit receiving a row address signal which selects a real word line of each of the memory blocks and a column address signal which selects a real bit line in each of the memory blocks at different parts of the external address terminals at a same timing, wherein:

the memory blocks each include the real bit line coupled to the real memory cells and a redundancy bit line coupled to the redundancy memory cells; and the address input circuit receives a part of the column address signal as the block address signal at the block address terminal.

9. The semiconductor memory according to claim 8, further comprising a command input circuit receiving a write command and a read command which select one of the real bit line and the redundancy bit line in order to access to either the real memory cells or the redundancy memory cells, wherein:

during the test mode, the address input circuit receives the forced redundancy signal at the block address terminal in response to the write command and the read command; and the redundancy access unit judges a level of the forced redundancy signal in response to the write command and the read command.

10. The semiconductor memory according to claim 7, further comprising a data output unit sequentially outputting parallel read data signals which are output from one of the memory blocks in response to the read command as many as a number corresponding to a burst length during the normal operation mode, and sequentially outputting parallel read data signals which are output from the plurality of memory blocks in response to the read command irrespective of the burst length during the test mode.

11. A system comprising:

a plurality of memory blocks being accessed independently during a normal operation mode, being accessed simultaneously during a test mode in order for common data to be written to the plurality of memory blocks, and including real memory cells and redundancy memory cells;

a block control unit selecting one of the memory blocks according to a block address signal specifying one of the memory blocks during the normal operation mode, and selecting the plurality of memory blocks irrespective of the block address signal during the test mode;

a redundancy access unit accessing the redundancy memory cells of one of the memory blocks corresponding to the block address signal when an external address signal matches a defect address during the normal operation mode, and simultaneously accessing the redundancy memory cells of the plurality of memory blocks when a forced redundancy signal indicates a first level during the test mode, the forced redundancy signal being supplied to one of a block address terminal receiving the block address signal and a part of external address terminals receiving the external address signal; and a controller controlling an access of the semiconductor memory.

12. An operating method of a semiconductor memory which includes a plurality of memory blocks being accessed independently during a normal operation mode, being accessed simultaneously during a test mode in order for common data to be written to the plurality of memory blocks, and including real memory cells and redundancy memory cells, the operating method comprising:

selecting one of the memory blocks according to a block address signal specifying one of the memory blocks during the normal operation mode;

selecting the plurality of memory blocks irrespective of the block address signal during the test mode;

accessing the redundancy memory cells of one of the memory blocks corresponding to the block address signal when an external address signal matches a defect address during the normal operation mode; and simultaneously accessing the redundancy memory cells of the plurality of memory blocks when a forced redundancy signal indicates a first level during the test mode, the forced redundancy signal being supplied to one of a block address terminal receiving the block address signal and a part of external address terminals receiving the external address signal.

13. A manufacturing method of a semiconductor memory which includes:

a plurality of memory blocks being accessed independently during a normal operation mode, being accessed simultaneously during a test mode in order for common data to be written to the plurality of memory blocks, and including real memory cells and redundancy memory cells;

a block control unit selecting one of the memory blocks according to a block address signal specifying one of the memory blocks during the normal operation mode, and, selecting the plurality of memory blocks irrespective of the block address signal during the test mode; and a redundancy access unit accessing the redundancy memory cells of one of the memory blocks corresponding to the block address signal when an external address signal matches a defect address during the normal operation mode, and simultaneously accessing the redundancy memory cells of the plurality of memory blocks when a forced redundancy signal indicates a first level during the test mode, the forced redundancy signal being supplied to one of a block address terminal receiving the block address signal and a part of external address terminals receiving the external address signal, the manufacturing method comprising:

making the semiconductor memory enter the test mode;

supplying the forced redundancy signal including the first level in one of the block address terminal and the part of the external address terminals receiving the external address signal;

writing a data signal being common to the redundancy memory cells of the plurality of memory blocks;

reading data signals from the redundancy memory cells of the plurality of memory blocks; and testing the redundancy memory cells by comparing the data signals being read with an expected value.

* * * * *